(12) United States Patent
Cho et al.

(10) Patent No.: US 9,691,928 B2
(45) Date of Patent: Jun. 27, 2017

(54) INVERTED METAMORPHIC MULTIJUNCTION SOLAR CELLS WITH DOPED ALPHA LAYER

(71) Applicant: SolAero Technologies Corp., Albuquerque, NM (US)

(72) Inventors: Benjamin Cho, Albuquerque, NM (US); Yong Lin, Albuquerque, NM (US); Pravin Patel, Albuquerque, NM (US); Mark A. Stan, Albuquerque, NM (US); Arthur Cornfeld, Sandia Park, NM (US); Daniel McGlynn, Albuquerque, NM (US); Fred Newman, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 799 days.

(21) Appl. No.: 14/044,147

(22) Filed: Oct. 2, 2013

(65) Prior Publication Data

US 2015/0090321 A1    Apr. 2, 2015

(51) Int. Cl.
*H01L 21/00* (2006.01)
*H01L 31/0687* (2012.01)
(Continued)

(52) U.S. Cl.
CPC ...... *H01L 31/06875* (2013.01); *H01L 31/078* (2013.01); *H01L 31/184* (2013.01);
(Continued)

(58) Field of Classification Search
CPC ............. H01L 31/06875; H01L 31/078; H01L 31/184; H01L 31/1844; Y02E 10/544; Y02P 70/521
See application file for complete search history.

(56) References Cited

U.S. PATENT DOCUMENTS

2009/0078311 A1\* 3/2009 Stan .................. H01L 31/02242
136/255
2010/0093127 A1\* 4/2010 Sharps .............. H01L 31/02242
438/64

FOREIGN PATENT DOCUMENTS

JP      07-022327    1/1995
JP       07022327  \* 1/1995

OTHER PUBLICATIONS

Lewis et al., "The Crystallographic Connection of MOCVD-Grown Monolithic Cascade Subcells Via Transparent Graded Layers," *Journal of Crystal Growth*, 1984; 69:515-526.
(Continued)

*Primary Examiner* — Duy T Nguyen

(57) ABSTRACT

A method of forming a multijunction solar cell comprising at least an upper subcell, a middle subcell, and a lower subcell, the method including forming a first alpha layer over said middle solar subcell using a surfactant and dopant including selenium, the first alpha layer configured to prevent threading dislocations from propagating; forming a metamorphic grading interlayer over and directly adjacent to said first alpha layer; forming a second alpha layer using a surfactant and dopant including selenium over and directly adjacent to said grading interlayer to prevent threading dislocations from propagating; and forming a lower solar subcell over said grading interlayer such that said lower solar subcell is lattice mismatched with respect to said middle solar subcell.

10 Claims, 34 Drawing Sheets

(51) Int. Cl.
*H01L 31/18* (2006.01)
*H01L 31/078* (2012.01)

(52) U.S. Cl.
CPC ........ *H01L 31/1844* (2013.01); *Y02E 10/544* (2013.01); *Y02P 70/521* (2015.11)

(56) References Cited

OTHER PUBLICATIONS

Lewis et al., "Recent Developments in Multijunction Solar Cell Research," *Solar Cells*, 1988; 24:171-183.

* cited by examiner

INVERTED METAMORPHIC MULTIJUNCTION SOLAR CELLS WITH DOPED ALPHA LAYER

GOVERNMENT RIGHTS STATEMENT

This invention was made with government support under Contract No. FA9453-04-2-0041 awarded by the U.S. Air Force. The Government has certain rights in the invention.

REFERENCE TO RELATED APPLICATIONS

This application is related to co-pending U.S. patent application Ser. No. 14/026,818 filed Sep. 13, 2013.

This application is related to co-pending U.S. patent application Ser. No. 13/954,610 and Ser. No. 13/954,630 filed Jul. 30, 2013.

This application is related to co-pending U.S. patent application Ser. No. 13/921,756 filed Jun. 19, 2013.

This application is related to co-pending U.S. patent application Ser. No. 13/836,742 filed Mar. 15, 2013.

This application is related to co-pending U.S. patent application Ser. No. 13/831,406 filed Mar. 14, 2013.

This application is related to co-pending U.S. patent application Ser. No. 13/768,683 filed Feb. 13, 2013.

This application is related to U.S. patent application Ser. No. 12/637,241, filed Dec. 14, 2009, which is a continuation-in-part of U.S. patent application Ser. No. 11/616,596, filed Dec. 27, 2006, and Ser. No. 12/544,001, filed Aug. 19, 2009.

This application is related to co-pending U.S. patent application Ser. No. 13/604,833 filed Sep. 6, 2012, which is a continuation-in-part of U.S. patent application Ser. No. 12/637,241, filed Dec. 14, 2009, which in turn is a continuation-in-part of U.S. patent application Ser. No. 11/616,596, filed Dec. 27, 2006, and Ser. No. 12/544,001, filed Aug. 19, 2009.

This application is related to co-pending U.S. patent application Ser. No. 13/569,794 filed Aug. 9, 2012.

This application is related to co-pending U.S. patent application Ser. No. 13/547,334 filed Jul. 12, 2012.

This application is related to co-pending U.S. patent application Ser. No. 13/473,802 filed May 17, 2012.

This application is related to co-pending U.S. patent application Ser. No. 13/465,477 filed May 7, 2012.

This application is related to co-pending U.S. patent application Ser. No. 13/463,069 filed May 3, 2012.

This application is related to co-pending U.S. patent application Ser. No. 13/440,331 filed Apr. 5, 2012.

This application is related to co-pending U.S. patent application Ser. No. 13/415,425 filed Mar. 8, 2012.

This application is related to co-pending U.S. patent application Ser. No. 13/401,181 filed Feb. 21, 2012.

This application is related to co-pending U.S. patent application Ser. No. 13/372,068 filed Feb. 13, 2012.

This application is related to co-pending U.S. patent application Ser. No. 13/315,877 filed Dec. 9, 2011.

This application is related to co-pending U.S. patent application Ser. No. 12/844,673 filed Jul. 27, 2010.

This application is related to co-pending U.S. patent application Ser. No. 12/813,408 filed Jun. 10, 2010.

This application is related to U.S. patent application Ser. No. 12/775,946 filed May 7, 2010, now U.S. Pat. No. 8,187,907.

This application is related to co-pending U.S. patent application Ser. No. 12/716,814, filed Mar. 3, 2010.

This application is related to co-pending U.S. patent application Ser. No. 12/708,361, filed Feb. 18, 2010.

This application is related to co-pending U.S. patent application Ser. No. 12/544,001, filed Aug. 19, 2009.

This application is related to U.S. patent application Ser. No. 12/537,361, filed Aug. 7, 2009, now U.S. Pat. No. 8,262,856.

This application is related to co-pending U.S. patent application Ser. No. 12/337,014 filed Dec. 17, 2008, now U.S. Pat. No. 7,785,989.

This application is related to U.S. patent application Ser. No. 12/267,812 filed Nov. 10, 2008, now U.S. Pat. No. 8,236,600.

This application is related to co-pending U.S. patent application Ser. No. 12/190,449, filed Aug. 12, 2008, now U.S. Pat. No. 7,741,146, and its divisional patent application Ser. No. 12/816,205, filed Jun. 15, 2010, now U.S. Pat. No. 8,039,291.

This application is related to U.S. patent application Ser. No. 12/187,477, filed Aug. 7, 2008, now U.S. Pat. No. 8,263,853, and its co-pending divisional application U.S. patent application Ser. No. 13/560,663 filed Jul. 27, 2012.

This application is related to co-pending U.S. patent application Ser. No. 12/218,558 filed Jul. 16, 2008.

This application is related to co-pending U.S. patent application Ser. No. 12/123,864 filed May 20, 2008.

This application is related to co-pending U.S. patent application Ser. No. 12/023,772, filed Jan. 31, 2008.

This application is related to U.S. patent application Ser. No. 11/956,069, filed Dec. 13, 2007, and its divisional application Ser. No. 12/187,454 filed Aug. 7, 2008, now U.S. Pat. No. 7,727,795.

This application is also related to co-pending U.S. patent application Ser. Nos. 11/860,142 and 11/860,183 filed Sep. 24, 2007.

This application is also related to co-pending U.S. patent application Ser. No. 11/445,793 filed Jun. 2, 2006, now U.S. Pat. No. 8,536,445 and its divisional Ser. No. 12/758,390 filed Apr. 12, 2010, now U.S. Pat. No. 8,536,446 and Ser. No. 13/956,133 filed Jul. 31, 2013.

BACKGROUND OF THE INVENTION

1. Field of the Invention

The present invention relates to the field of semiconductor devices, and to fabrication processes and devices such as multijunction solar cells based on III-V semiconductor compounds including a metamorphic layer. Some embodiments of such devices are also known as inverted metamorphic multijunction solar cells.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500x), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, the power-to-weight ratio of a solar cell becomes increasingly more important, and there is increasing interest in lighter weight, "thin film" type solar cells having both high efficiency and low mass.

Typical III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

Inverted metamorphic solar cell structures based on III-V compound semiconductor layers, such as described in M. W. Wanlass et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005), present an important conceptual starting point for the development of future commercial high efficiency solar cells. However, the materials and structures for a number of different layers of the cell proposed and described in such reference present a number of practical difficulties, particularly relating to the most appropriate choice of materials and fabrication steps.

SUMMARY OF THE INVENTION

Objects of the Invention

It is an object of the present invention to provide increased photoconversion efficiency in a multijunction solar cell.

It is another object of the present invention to provide increased photoconversion efficiency in a multijunction solar cell by increasing the open circuit voltage of the overall solar cell.

It is another object of the present invention to provide increased open circuit voltage in a multijunction solar cell by utilizing a non-isoelectronic surfactant/dopant during the processing of one or more layers.

It is another object of the present disclosure to decrease the statistical standard variation in the open circuit voltage from cell to cell as laid out across the surface of a single wafer as processed in an MOCVD reactor.

It is another object of the present invention to provide uniform and increased open circuit voltage or current in the multijunction solar cell(s) implemented on a single wafer as processed in an MOCVD reactor by utilizing a selenium or tellurium dopant during deposition of a grading metamorphic buffer layer.

It is another object of the present invention to provide uniform and increased open circuit voltage or current in inverted metamorphic multijunction solar cell(s) implemented on a single wafer as processed in an MOCVD reactor by utilizing a selenium or tellurium dopant during deposition of one or more layers adjacent to the grading metamorphic buffer layer.

Some implementations of the present disclosure may incorporate or implement fewer of the aspects and features noted in the foregoing objects.

Features of the Invention

Briefly, and in general terms, the present disclosure provides a method of forming a multijunction solar cell comprising at least an upper solar subcell, a middle solar subcell, and a lower solar subcell, the method including forming a first barrier layer over said middle solar subcell using a dopant/surfactant including selenium, the first alpha layer configured to prevent threading dislocations from propagating; forming a metamorphic grading interlayer over and directly adjacent to said first alpha layer; and forming a lower solar subcell over said grading interlayer such that said lower solar subcell is lattice mismatched with respect to said middle solar subcell.

In another aspect, the present disclosure provides a method of forming a multijunction solar cell comprising at least an upper solar subcell, a middle solar subcell, and a lower solar subcell, the method including forming a metamorphic grading interlayer using a dopant/surfactant including selenium over and adjacent to said middle solar subcell; and forming a lower solar subcell over said grading interlayer such that said lower solar subcell is lattice mismatched with respect to said middle solar subcell.

In another aspect, the present disclosure provides a method of forming a multijunction solar cell comprising at least an upper solar subcell, a middle solar subcell, and a lower solar subcell, the method including forming a first alpha layer over said middle solar subcell using a dopant/surfactant including selenium, the first alpha layer configured to prevent threading dislocations from propagating; forming a metamorphic grading interlayer using a dopant/surfactant including selenium over and directly adjacent to said first alpha layer; and forming a lower solar subcell over said grading interlayer such that said lower solar subcell is lattice mismatched with respect to said middle solar subcell.

In another aspect, the present disclosure provides a method of forming a multijunction solar cell comprising at least an upper solar subcell, a middle solar subcell, and a lower solar subcell, the method including forming a first alpha layer over said middle solar subcell using a dopant/surfactant including selenium, the first alpha layer configured to prevent threading dislocations from propagating; forming a metamorphic grading interlayer over and directly adjacent to said first alpha layer; forming a second alpha layer using a dopant/surfactant including selenium over and directly adjacent to said grading interlayer to prevent threading dislocations from propagating; and forming a lower solar subcell over said second alpha layer such that said lower solar subcell is lattice mismatched with respect to said middle solar subcell.

In another aspect, the present disclosure provides a method of forming a multijunction solar cell comprising at least an upper solar subcell, a middle solar subcell, and a lower solar subcell, the method including forming a first alpha layer over said middle solar subcell using a dopant/surfactant including selenium, the first alpha layer configured to prevent threading dislocations from propagating; forming a metamorphic grading interlayer using a dopant/ surfactant including selenium over and directly adjacent to said first alpha layer; forming a second alpha layer using a dopant/surfactant including selenium over and directly adjacent to said grading interlayer to prevent threading dislocations from propagating; and forming a lower solar subcell over said second alpha layer such that said lower solar subcell is lattice mismatched with respect to said middle solar subcell.

In another aspect, the present disclosure provides a multijunction solar cell comprising at least an upper solar subcell, a middle solar subcell, and a lower solar subcell, the method including forming a first alpha layer over said middle solar subcell using a dopant/surfactant including selenium, the first alpha layer configured to prevent threading dislocations from propagating; forming a metamorphic grading interlayer over and directly adjacent to said first alpha layer; and forming a lower solar subcell over said grading interlayer such that said lower solar subcell is lattice mismatched with respect to said middle solar subcell.

In another aspect, the present disclosure provides a method of forming a multijunction solar cell comprising at least an upper solar subcell, a middle solar subcell, and a lower solar subcell, the method including forming a metamorphic grading interlayer using a dopant/surfactant including selenium over and adjacent to said middle solar subcell; and forming a lower solar subcell over said grading interlayer such that said lower solar subcell is lattice mismatched with respect to said middle solar subcell.

In another aspect, the present disclosure provides a method of forming a multijunction solar cell comprising at least an upper solar subcell, a middle solar subcell, and a lower solar subcell, the method including forming a first alpha layer over said middle solar subcell using a dopant/surfactant including selenium, the first alpha layer configured to prevent threading dislocations from propagating; forming a metamorphic grading interlayer using a dopant/surfactant including selenium over and directly adjacent to said first alpha layer; and forming a lower solar subcell over said grading interlayer such that said lower solar subcell is lattice mismatched with respect to said middle solar subcell.

In another aspect, the present disclosure provides a method of forming a multijunction solar cell comprising at least an upper solar subcell, a middle solar subcell, and a lower solar subcell, the method including forming a first alpha layer over said middle solar subcell using a dopant/surfactant including selenium, the first alpha layer configured to prevent threading dislocations from propagating; forming a metamorphic grading interlayer over and directly adjacent to said first alpha layer; forming a second alpha layer using a dopant/surfactant including selenium over and directly adjacent to said grading interlayer to prevent threading dislocations from propagating; and forming a lower solar subcell over said second alpha layer such that said lower solar subcell is lattice mismatched with respect to said middle solar subcell.

In another aspect, the present disclosure provides a multijunction solar cell comprising at least an upper solar subcell, a middle solar subcell, and a lower solar subcell; a metamorphic grading interlayer having a selenium dopant disposed over said middle subcell; and a lower solar subcell disposed over said grading interlayer such that said lower solar subcell is lattice mismatched with respect to said middle solar subcell.

In another aspect, the present disclosure provides a multijunction solar cell comprising at least an upper solar subcell, a middle solar subcell, and a lower solar subcell; a first alpha layer having a selenium dopant disposed over said middle solar subcell; a metamorphic grading interlayer disposed over and directly adjacent to said first alpha layer; and a lower solar subcell disposed over said metamorphic grading interlayer such that said lower solar subcell is lattice mismatched with respect to said middle solar subcell.

In another aspect, the present disclosure provides a multijunction solar cell comprising at least an upper solar subcell, a middle solar subcell, and a lower solar subcell; a first alpha layer disposed over said middle solar subcell; a metamorphic grading interlayer having a selenium dopant disposed over and directly adjacent to said first alpha layer; and a lower solar subcell disposed over said second alpha layer such that said lower solar subcell is lattice mismatched with respect to said middle solar subcell.

In another aspect, the present disclosure provides a multijunction solar cell comprising at least an upper solar subcell, a middle solar subcell, and a lower solar subcell; a first alpha layer having a selenium dopant disposed over said middle solar subcell; a metamorphic grading interlayer having a selenium dopant disposed over and directly adjacent to said first alpha layer; and a lower solar subcell disposed over said second alpha layer such that said lower solar subcell is lattice mismatched with respect to said middle solar subcell.

In another aspect, the present disclosure provides a multijunction solar cell comprising at least an upper solar subcell, a middle solar subcell, and a lower solar subcell; a first alpha layer having a selenium dopant disposed over said middle solar subcell; a metamorphic grading interlayer having a selenium dopant disposed over and directly adjacent to said first alpha layer; a second alpha layer having a selenium dopant disposed over and directly adjacent to said grading interlayer; and a lower solar subcell disposed over said second alpha layer such that said lower solar subcell is lattice mismatched with respect to said middle solar subcell.

In some embodiments, tellurium may be used as a surfactant/dopant in lieu of selenium.

In some embodiments, a second alpha layer is provided which is disposed over and directly adjacent to said grading interlayer.

In some embodiments, the second alpha layer is a different thickness than the first alpha layer.

In some embodiments, the second alpha layer has the same doping as the first alpha layer.

In another aspect, the present disclosure provides a method of forming a multijunction solar cell comprising at least an upper solar subcell, a middle solar subcell, and a lower solar subcell, the method comprising: providing a first substrate for the epitaxial growth of semiconductor material; forming a first solar subcell on said substrate having a first band gap; forming a second solar subcell over said first solar subcell having a second band gap smaller than said first band gap; forming a first alpha layer over said second solar subcell having a selenium dopant using a surfactant including selenium, the first alpha layer configured to prevent threading dislocations from propagating; forming a metamorphic grading interlayer having a selenium dopant over and directly adjacent to said first alpha layer, said grading interlayer having a third band gap greater than said second band gap, and the grading interlayer having a different composition than the first alpha layer; forming a second alpha layer having a selenium dopant using a surfactant including selenium over and directly adjacent to said grading interlayer to prevent threading dislocations from propagating, the second alpha layer having a different composition than the grading interlayer; forming a third solar subcell over said grading interlayer having a fourth band gap smaller than said second band gap such that said third solar subcell is lattice mismatched with respect to said second solar subcell; the grading interlayer being compositionally graded with a lattice constant that matches the lattice constant of the second solar subcell on a first side and matches the lattice constant of the third solar subcell on a second side; and the grading interlayer having a different composition than each of the first and second alpha layers.

In another aspect, the present disclosure provides a multijunction solar cell comprising: a first solar subcell on said substrate having a first band gap; a second solar subcell over said first solar subcell having a second band gap smaller than said first band gap; a first alpha layer over said second solar subcell using a surfactant including selenium, the first alpha layer configured to prevent threading dislocations from propagating; a metamorphic grading interlayer over and directly adjacent to said first alpha layer, said grading interlayer having a third band gap greater than said second band gap, a second alpha layer using a surfactant including selenium over and directly adjacent to said grading interlayer to prevent threading dislocations from propagating, the second alpha layer having a different composition than the first alpha layer; and a third solar subcell over said grading interlayer having a fourth band gap smaller than said second band gap such that said third solar subcell is lattice mismatched with respect to said second solar subcell, wherein the grading interlayer being compositionally graded with a lattice constant that matches the lattice constant of the second solar subcell on a first side and matches the lattice constant of the third solar subcell on a second side; and the grading interlayer having a different composition than each of the first and second alpha layers.

In another aspect the present disclosure provides a four junction solar cell utilizing two metamorphic layers. More particularly the present disclosure provides a multijunction solar cell including an upper first solar subcell having a first band gap; a second solar subcell adjacent to said first solar subcell and having a second band gap smaller than said first band gap; a first graded interlayer provided adjacent to said second solar subcell; said first graded interlayer having a third band gap greater than said second band gap; a third solar subcell is provided adjacent to said first graded interlayer and having a fourth band gap smaller than said second band gap such that said third subcell is lattice mismatched with respect to said second subcell; a second graded interlayer is provided adjacent to said third solar subcell; said second graded interlayer having a fifth band gap greater than said fourth band gap; a fourth solar subcell is provided adjacent to said second graded interlayer, said fourth subcell having a sixth band gap smaller than said fourth band gap such that said fourth subcell is lattice mismatched with respect to said third subcell, wherein a first alpha layer is provided over said second solar subcell using a surfactant and dopant including selenium, the first alpha layer being configured to prevent threading dislocations from propagating.

In some embodiments, a second alpha layer is provided over said second solar subcell using a surfactant and dopant including selenium, the second alpha layer also configured to prevent threading dislocations from propagating.

In some embodiments, the first graded interlayer is grown using a surfactant and dopant including selenium.

In some embodiments, the selenium is introduced in the MOCVD reactor as a precursor gas of di-isopropyl selenide.

In some embodiments, tellurium may be used as a surfactant/dopant in lieu of selenium in the first or second alpha layers, or in the first graded interlayer. In those embodiments, tellurium is introduced as a precursor gas of diethyltellurium or di-isopropyl telluride.

In some embodiments, said first alpha layer is composed of any As, P, N, or Sb based III-V compound semiconductors having a band gap energy greater than or equal to that of the grading interlayer.

In some embodiments, said first alpha layer is composed of GaInP.

In some embodiments, said second alpha layer is composed of any As, P, N, or Sb based III-V compound semiconductors having a band gap energy greater than or equal to that of the grading interlayer.

In some embodiments, said second alpha layer is composed of GaInP.

In some embodiments, said first subcell in composed of an GaInP, GaAs, GaInAs, GaAsSb, or GaInAsN emitter region and an GaInP, GaAs, GaInAs, GaAsSb, or GaInAsN base region; the second subcell is composed of an InGaAs base and emitter regions, or an InGaP emitter region and a GaAs base region; and the third subcell is composed of an InGaAs emitter region and an InGaAs base region.

In some embodiments, said first subcell in composed of an GaInP, GaAs, GaInAs, GaAsSb, or GaInAsN emitter region and an GaInP, GaAs, GaInAs, GaAsSb, or GaInAsN base region; the second subcell is composed of an InGaAs base and emitter regions, or an InGaP emitter region and a GaAs base region; and the third subcell is composed of an InGaP emitter region and an InGaAs base region.

In some embodiments, said grading interlayer is composed of any of the As, N, Sb based III-V compound semiconductors subject to the constraints of having the in-plane lattice parameter greater or equal to that of the second solar subcell and less than or equal to that of the third solar subcell, and having a band gap energy greater than that of the second solar subcell.

In some embodiments, the grading interlayer material is composed of $(In_xGa_{1-x})Al_{1-y}As$ with $0<x<1$ and $0<y<1$, and x and y selected such that the band gap of the transition material remains constant throughout its thickness.

In another aspect, the present disclosure provides attaching a surrogate second substrate over said bottom solar subcell and removing the first substrate.

In another aspect of the present invention, the solar cells each include a sequence of layers including a first top subcell comprising a first semiconductor material with a first band gap and a first lattice constant; a second subcell comprising a second semiconductor material with a second band gap and a second lattice constant, wherein the second band gap is less than the first band gap and the second lattice constant is equal to the first lattice constant; a grading interlayer below the second subcell, and having a third band gap greater than said second band gap, and having a lattice constant that changes gradually from the second lattice constant to a third lattice constant; and a third subcell comprising a third semiconductor material with a fourth band gap and a third lattice constant, wherein the fourth band gap is less than the second band gap and the third subcell is lattice mismatched with respect to the second subcell.

Some implementations of the present invention may incorporate or implement fewer of the aspects and features noted in the foregoing summaries.

Additional aspects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

BRIEF DESCRIPTION OF THE DRAWINGS

The invention will be better and more fully appreciated by reference to the following detailed description when considered in conjunction with the accompanying drawings, wherein.

DESCRIPTION OF THE PREFERRED EMBODIMENT

Figure 1A:
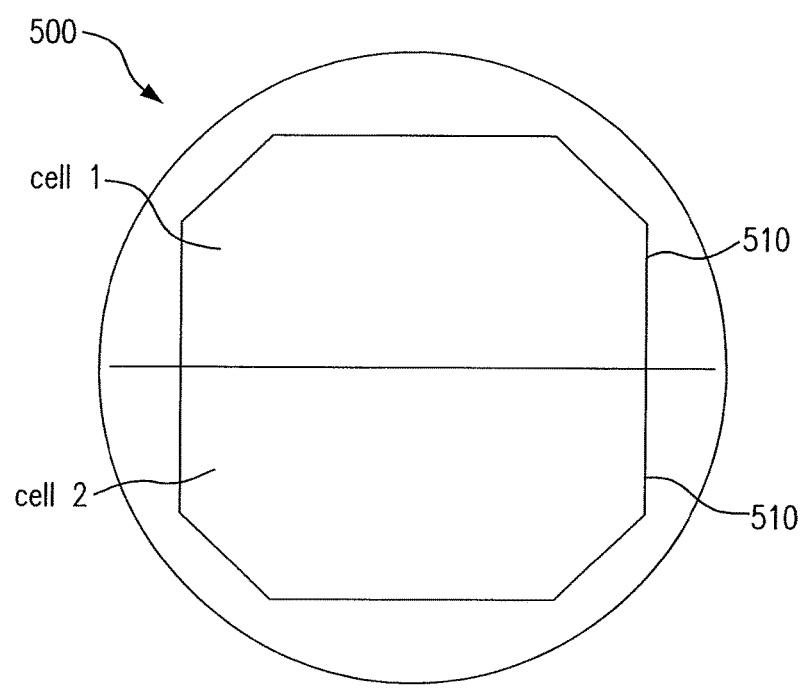
FIG. 1A is a top plan view of a wafer in which two solar cells are fabricated.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.1 eV), which would normally be the "top" subcells facing the solar radiation, are initially grown epitaxially directly on a semiconductor growth substrate, such as for example GaAs or Ge, and such subcells are consequently lattice-matched to such substrate. One or more lower band gap middle subcells (i.e. with band gaps in the range of 1.2 to 1.8 eV) can then be grown on the high band gap subcells.

At least one lower subcell is formed over the middle subcell such that the at least one lower subcell is substantially lattice-mismatched with respect to the growth substrate and such that the at least one lower subcell has a third lower band gap (i.e., a band gap in the range of 0.7 to 1.2 eV). A surrogate substrate or support structure is then attached or provided over the "bottom" or substantially lattice-mismatched lower subcell, and the growth semiconductor substrate is subsequently removed. (The growth substrate may then subsequently be re-used for the growth of second and subsequent solar cells).

A variety of different features and aspects of inverted metamorphic multijunction solar cells are disclosed in the related applications noted above. Some or all of such features may be included in the structures and processes associated with the solar cells of the present invention. Neither, some or all of such aspects may be included in the structures and processes associated with the semiconductor devices and/or solar cells of the present disclosure.

One aspect of the present disclosure is directed to the problem of increasing the overall operating photoconversion efficiency of multijunction solar cells in a high volume production environment using an MOCVD process, and in particular that of inverted metamorphic multijunction (IMM) solar cells. The photoconversion efficiency of a multijunction solar cell is a function of a number of electro-optical variables associated with each of the active layers of each of the subcells in the solar cell, including the open circuit voltage Voc. The introduction of a graded metamorphic layer in a solar cell produces stresses on the directly adjacent active layers, and such stresses result in the formation of recombination centers or threading dislocations which affect the electrical performance of such layers, and in turn the photoconversion efficiency. More imperatively, in a high volume production environment the relative number of such solar cells that are significantly affected by such stresses are substantial, which therefore affects the statistical distribution of the photoconversion efficiency associated with a particular solar cell design and process. Another aspect of the present disclosure is therefore directed to the problem of decreasing the overall standard deviation statistical distribution so that a larger number of cells produced in a production run fall closely to the mean photoconversion efficiency.

In that connection, prior to discussing the specific embodiments of the present disclosure, a brief discussion of some of the issues associated with the design of multijunction solar cells, and in particular inverted metamorphic solar cells, and the context of the composition or deposition of various specific layers in embodiments of the product as specified and defined by Applicant is in order here.

There are a multitude of properties that should be considered in specifying and selecting the composition of, inter alia, a specific semiconductor layer, the back metal layer, the adhesive or bonding material, or the composition of the supporting material for mounting a solar cell thereon. For example, some of the properties that should be considered when selecting a particular layer or material are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

In view of the trade-offs among these properties, it is not always evident that the selection of a specific material based on one of its characteristic physical chemical properties is always or typically "the best" or "optimum" from a commercial standpoint or for Applicant's purposes. For example, theoretical studies may suggest the use of a quaternary material with a certain band gap for a particular subcell would be the optimum choice for that subcell layer to maximize the photovoltaic efficiency of the solar cell based on fundamental semiconductor physics. As an example, the teachings of academic papers and related proposals for the design of very high photoconversion efficiency (over 40%) solar cells may therefore suggest that a solar cell designer specify the use of a quaternary material (e.g., InGaAsP) for the active layer of a subcell. A few such devices may actually be fabricated by other researchers, photoconversion efficiency measurements made, and the results published as an example of the ability of such researchers to advance the progress of science by increasing the demonstrated photoconversion efficiency of a compound semiconductor multijunction solar cell. Although such experiments and publications are of "academic" interest, from the practical perspective of the Applicants in designing a compound semiconductor multijunction solar cell to be produced in high volume at reasonable cost and subject to manufacturing tolerances and variability inherent in the production processes, such an "optimum" design from an academic perspective is not necessarily the most desirable design in practice, and the teachings of such studies more likely than not point in the wrong direction and lead away from the proper design direction. Stated another way, such references may actually "teach away" from Applicant's research efforts and the ultimate solar cell design proposed by the Applicants.

It should therefore be evident that photoconversion efficiency alone, or the identification of one particular constituent element (e.g. indium, or aluminum) in a particular subcell, or the relative amount of that element, or the thickness, band gap, doping, or other physical or chemical characteristic of a layer incorporating that material, is not a "result effective variable" that one skilled in the art can simply specify and incrementally adjust to a particular level, and thereby achieve an improvement in the art of solar cell design and in the production technology of commercial solar cells. The photoconversion efficiency of a solar cell is not a simple linear algebraic equation as a function of the amount of gallium or aluminum or other element in a particular layer, or other variable. The growth of each of the epitaxial layers of a solar cell in an MOCVD reactor is a non-equilibrium thermodynamic process with dynamically changing spatial and temporal boundary conditions that is not readily or predictably modeled, where even different spaced apart cells on the same wafer may have significantly different electro-optical characteristics and photoconversion efficiency. The formulation and solution of the relevant simultaneous partial differential equations covering such processes are not within the ambit of those of ordinary skill in the art in the field of solar cell design.

To underscore the inapplicability of any "result effective variable" analysis or teaching to the design and development of an improved fabrication process for an inverted metamorphic multijunction solar cell presented in the present disclosure, the drawings and data in FIGS. 1A-1D and 2 depict the test configuration and test results associated with actual inverted metamorphic multijunction solar cells produced in a high volume commercial process using MOCVD reactors, and the manufacturability issues and variances that are of commercial concern.

FIG. 1A is a top plan view of a wafer in which two inverted metamorphic multijunction solar cells are fabricated, showing the scribe lines for detaching the cells from the wafer. Such an arrangement is utilized when it is desired to make substantial utilization of the area of the wafer when the peripheral shape of the solar cells is not an important consideration.

Figure 1B:
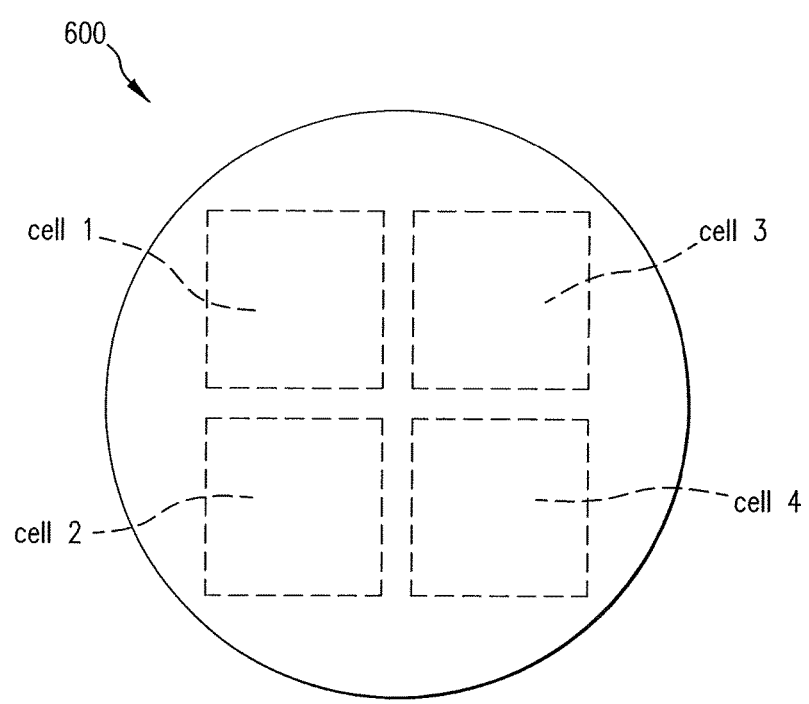
FIG. 1B is a top plan view of a wafer in which four solar cells are fabricated.

FIG. 1B is a top plan view of a wafer in which four solar cells are fabricated, showing the scribe lines or channels for detaching the cells from the wafer. Such an arrangement is utilized when square solar cells are required for the application.

Figure 1C:
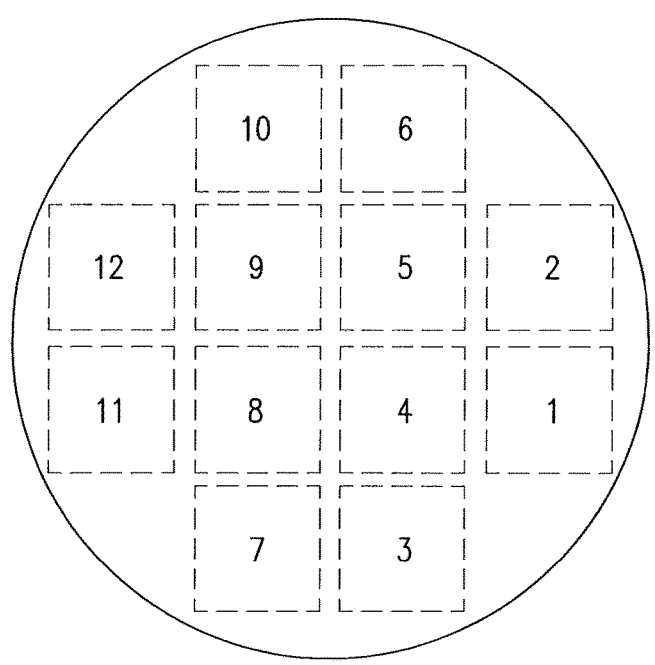
FIG. 1C is a top plan view of a test wafer in which twelve solar cells are fabricated.

To demonstratively illustrate one example of the types of problems encountered in a high volume production environment using an MOCVD process for the fabrication of inverted metamorphic solar cells, a test wafer (typically 100 mm in diameter in current production technology) is designed in which twelve inverted metamorphic multijunction test solar cells are simultaneously fabricated in an MOCVD production reactor using the processes disclosed in a number of the related applications noted above. The photoelectric conversion efficiency of solar cells in production varies slightly from batch to batch, which is a commercial issue that presents a technical problem to be understood and analyzed. Therefore, in order to better understand some of the factors that account for such variability, such a test wafer has been configured in order to make measurements of one or two key electrical parameters over the surface of a single wafer. After fabrication, probes are made of each of the test solar cells, and the open circuit voltage and short circuit current for each of the twelve test solar cells on a single wafer were measured to determine the spatial surface variation in the electrical properties of a solar cell implemented on that region of the wafer. FIG. 1C depicts a diagrammatic top plan view of such test wafer.

Figure 1D:
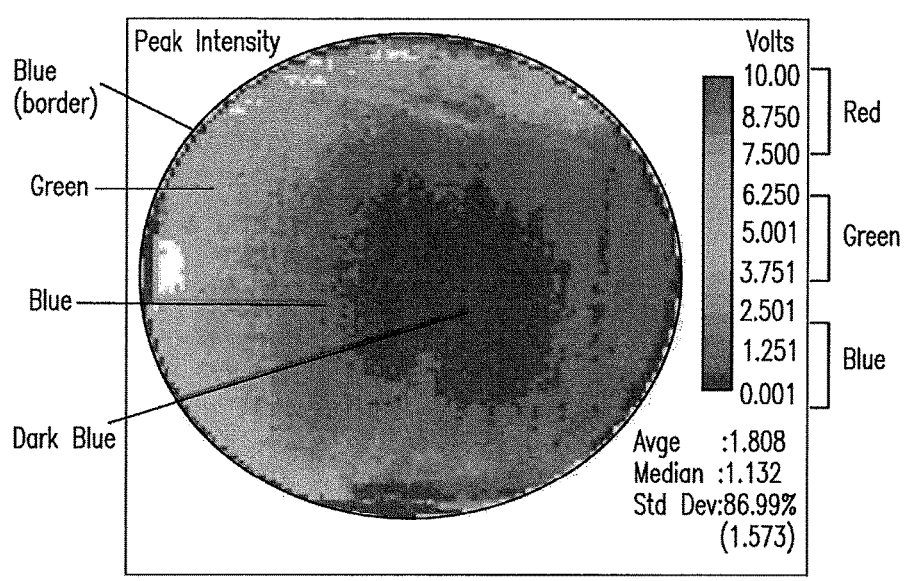
FIG. 1D is a top plan view of a photoluminescence measurement of a test solar cell wafer.

FIG. 1D is a top plan view of a test wafer depicting the results of a photoluminescence (PL) measurement over the surface of the wafer in which twelve solar cells are fabricated after processing. A photoluminescence measurement consists of shining a laser beam normal to the semiconductor surface. The photon energy of the beam must be equal to or greater than the bandgap of the semiconductor. The photons are absorbed in the semiconductor creating electron-hole pairs. The minority carriers recombine with the majority carriers. This recombination may be radiative with the emission of a photon with an energy equal to the semiconductor's bandgap, or non-radiative with the emission of heat in the form of a phonon(s), depending upon the material quality. For higher quality material, radiative recombination dominates the process, and the photoluminescence signal composed of photons can be detected outside the semiconductor with a photodetector. The intensity of the signal is a measure of the material quality. The semiconductor wafer may be moved with respect to the incident laser beam allowing a mapping of the photoluminescence signal across the entire semiconductor wafer surface. An example of a test instrument used to perform this measurement is the BioRad, Model RPM2000, of Bio-Rad Laboratories, Inc., of Berkeley, Calif.

The representation of FIG. 1D utilizes a parameter of voltage measured over the surface of the wafer, which in the example shown indicates a very high standard deviation of almost 87% or 1.573 volts, when the average voltage was 1.8 volts.

Figure 2:
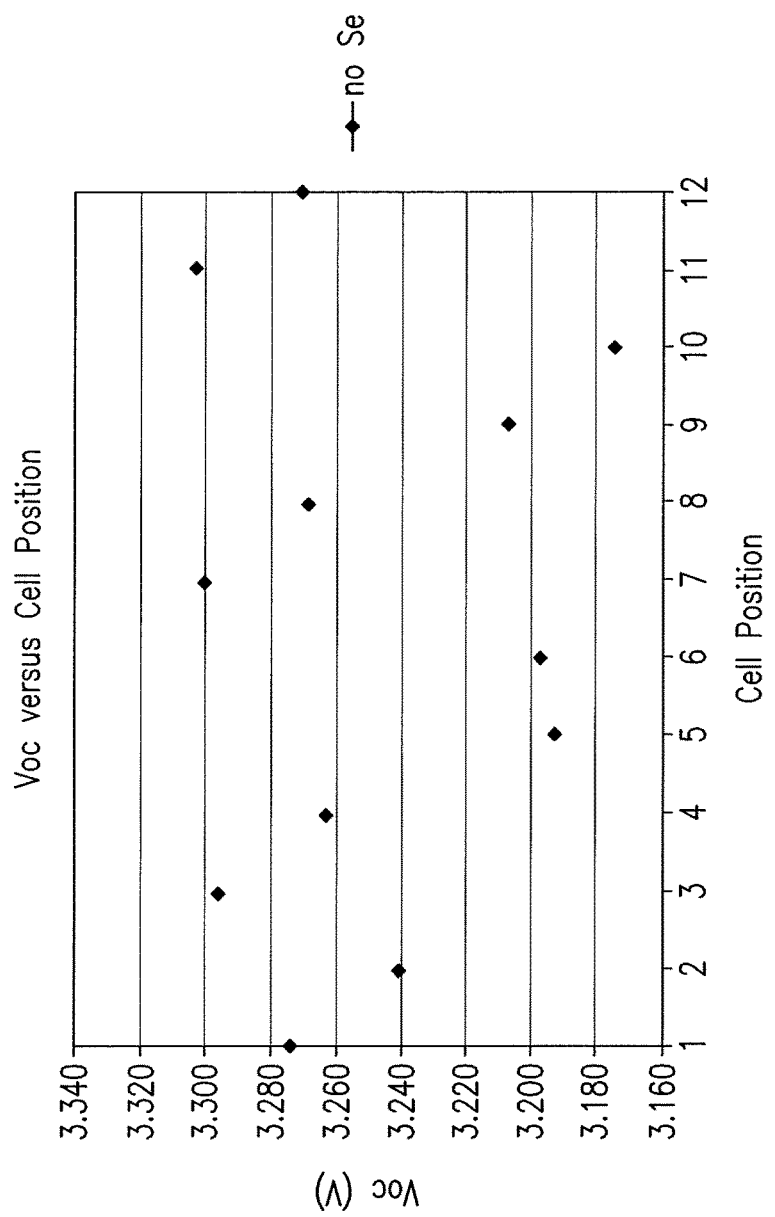
FIG. 2 is a graph representing the measured open circuit voltage of each of the twelve solar cells in a single test wafer as arranged in the layout depicted in FIG. 1C.

As another way to depict the variation between the twelve test cells in the wafer of FIG. 1C, FIG. 2 is a graph representing the measured open circuit voltage (Voc) of each of the twelve solar cells in a single test wafer as arranged in the layout depicted in FIG. 1C. The differences in the relatively low open circuit voltage in cells 5, 6 and 10 which are located on one side of the wafer, and that of cells 3, 7 and 11 which are located on the other side of the wafer, are significant. This non-uniformity in electrical properties indicated in FIG. 2, or the wide variability in the PL measurements shown in FIG. 1C, and the resulting variability in the electrical and performance characteristics of solar cells produced in a MOCVD reactor in a high volume commercial operating environment, is a technical "problem" inherent in an MOCVD production process to which the present disclosure is directed.

Based on the evidence of FIGS. 1D and 2, it should be clear that even when it is known that particular variables have an impact on electrical, optical, chemical, thermal or other characteristics, the nature of the impact often cannot be predicted with much accuracy, particularly when the variables interact in complex ways, leading to unexpected results and unintended consequences. Thus, significant trial and error, which may include the fabrication and evaluative testing of many prototype devices, often over a period of time of months if not years, is required to determine whether a proposed structure with layers of particular compositions, actually will operate as intended, let alone whether it can be fabricated in a reproducible high volume manner within the manufacturing tolerances and variability inherent in the production process, and necessary for the design of a commercially viable device.

Furthermore, as in the case here, where multiple variables interact in unpredictable ways, the proper choice of the combination of variables can produce new and unexpected results, and constitute an "inventive step".

Applicants have first recognized the technical problem presented by the evidence of FIGS. 1D and 2, and note its commercial importance in the context of high volume production environments using an MOCVD process. Applicants have discovered certain process and design improvements in the production of inverted metamorphic solar cells to address the technical issues and, moreover, favorably increase the open circuit voltage and short circuit current in different regions over the surface of specimen tested wafer. As a result of such design and process improvements, Applicants have thereby been able to (i) increase the overall operating photoconversion efficiency of multijunction solar cells, and the overall average photoconversion efficiency over numerous high volume lot runs; (ii) improve the uniformity of the overall operating photoconversion efficiency of multijunction solar cells; and (iii) decrease the statistical standard variation in the open circuit voltage from cell to cell as laid out across the surface of a single wafer as processed in an MOCVD reactor. Such improvements directly address the technical problem identified by Applicants.

In technical terms, one of the fundamental requirements is minimizing the density of defects, such as recombination sites or threading dislocations, that may appear in the active regions of the subcells caused by the physical stresses on the epitaxial layers as a result of the lattice mismatching between layers due to the introduction of the graded metamorphic layer in the design of inverted metamorphic solar cells.

A requisite to minimize threading dislocation creation is to maintain two-dimensional as opposed to three-dimensional growth. This condition may be influenced by several growth conditions: for example, growth temperature, grading rate, V to III ratio, template off-cut, alloy and surfactant assisted growth. The subject of U.S. patent application Ser. Nos. 12/047,842 and 12/102,550 was the surfactant assisted growth of the metamorphic layer, or the adjacent or "barrier" layers around the metamorphic layer. The subject of this patent application is related to the growth of the metamorphic layer, and the newly defined adjacent or "alpha" layers around the metamorphic layer, and to provide new evidence to distinguish and differentiate the earlier proposals of utilizing isoelectronic surfactants such as antimony (Sb) or bismuth (Bi), with the specific proposals of the present disclosure of using the non-isoelectronic or donor atom of selenium (Se) or tellurium (Te).

The present disclosure presents a new approach for maintaining the material quality of over substantially the entire surface area of the wafer, and thereby ensuring greater uniformity in electro-optical characteristics of each of the individual cells implemented on the wafer through introduction of a suitable dopant in (i) the graded metamorphic layer, and/or (ii) one or more of the adjacent layers to the graded metamorphic layer, which we designate as "alpha" layers. The use of the "alpha" terminology to designate such a layer is deliberately chosen so as to avoid the proposed layers being pigeonholed into comparisons with other layers that may have been disposed in similar positions in multijunction cells described in the literature if the adjective "barrier", "buffer" or another descriptive term referring to such layers were utilized. Identifying such layer as a distinct "alpha" layer, it is intended to signify that the alpha layer has a different and distinct composition from the directly adjacent layers. Thus, the introduction of the alpha layer into a solar cell is a distinctive feature of the present disclosure. By placing such a layer in the designated position in the illustrated embodiments, the alpha layer will be characterized to have a function and effect which results in a demonstrable improvement in the performance or other characteristic of the solar cell in which it is implemented, and specifically addresses the technical problems noted above.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

It should be apparent to one skilled in the art that the inclusion of additional semiconductor layers within the cell with similar or additional functions and properties is also within the scope of the present invention.

Figure 3:
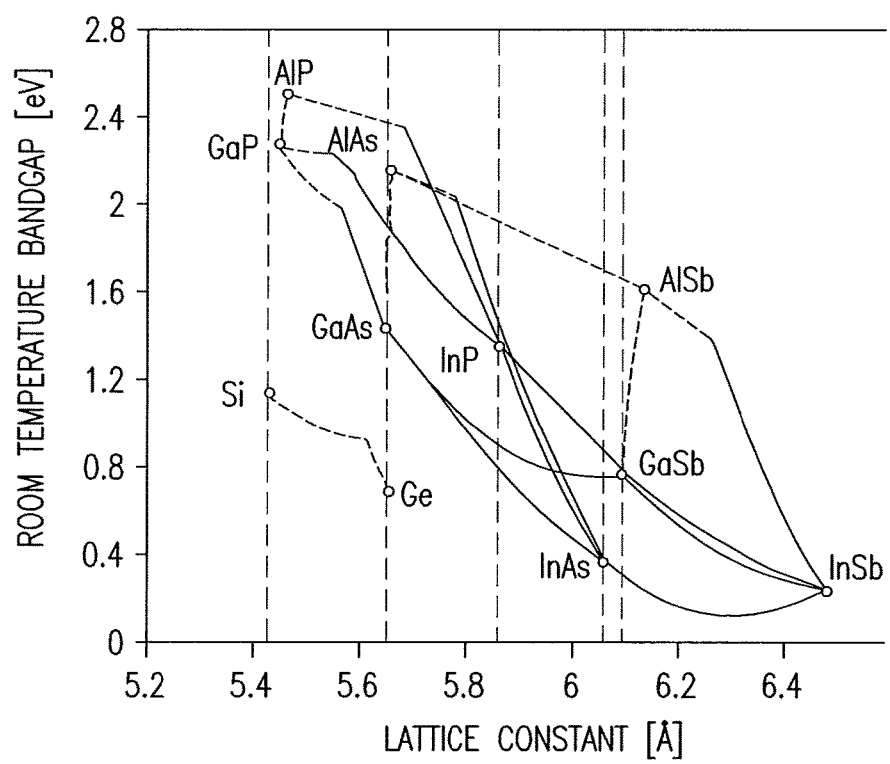
FIG. 3 is a graph representing the band gap of certain binary materials and their lattice constants.

FIG. 3 is a graph representing the band gap of certain binary materials and their lattice constants. The band gap and lattice constants of ternary materials are located on the lines drawn between typical associated binary materials (such as the ternary material GaAlAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), or other vapor deposition methods for the reverse growth may enable the layers in the monolithic semiconductor structure forming the cell to be grown with the required thickness, elemental composition, dopant concentration and grading and conductivity type.

Figure 4A:
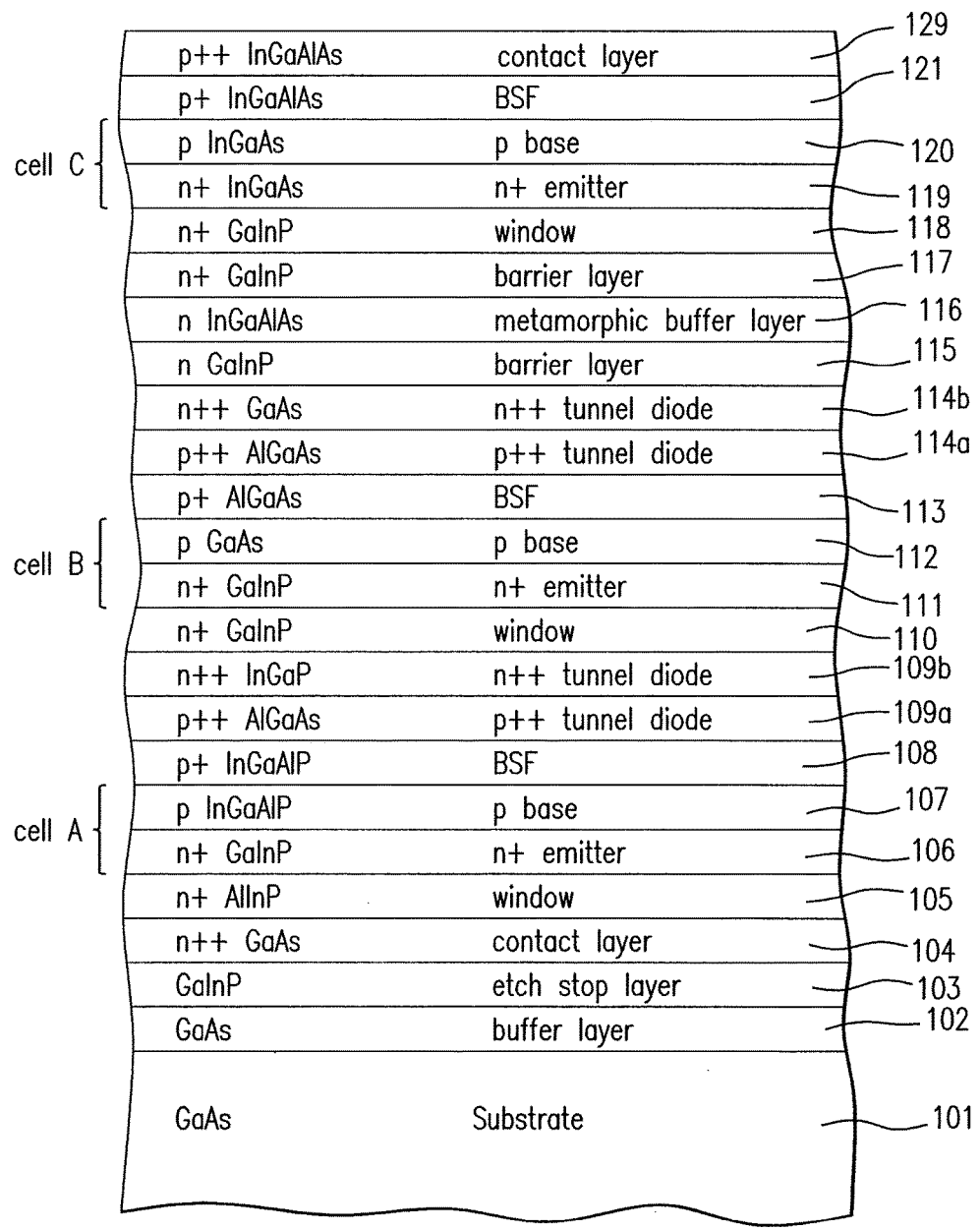
FIG. 4A is a cross-sectional view of a triple junction solar cell after the initial deposition of semiconductor layers on the growth substrate.

FIG. 4A depicts a triple junction solar cell after the sequential formation of the three subcells A, B and C on a GaAs growth substrate substantially similar to that described and depicted in a number of the related applications noted above. More particularly, there is shown a substrate 101, which is preferably gallium arsenide (GaAs), but may also be germanium (Ge) or other suitable material. For GaAs, the substrate may be a 15° off-cut substrate, that is to say, its surface is orientated 15° off the (100) plane towards the (111)A plane, as more fully described in U.S. patent application Ser. No. 12/047,944, filed Mar. 13, 2008. Other alternative growth substrates, such as described in U.S. patent application Ser. No. 12/337,014 filed Dec. 17, 2008, may be used as well.

In the case of a Ge substrate, a nucleation layer (not shown) is deposited directly on the substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably InGaAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally latticed matched to the growth substrate 101.

It should be noted that the multijunction solar cell structure could be formed by any suitable combination of group III to V elements listed in the periodic table subject to lattice constant and bandgap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorus (P), arsenic (As), antimony (Sb), and bismuth (Bi).

In one embodiment, the emitter layer 106 is composed of InGa(Al)P and the base layer 107 is composed of InGa(Al)P. The aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 21.

Subcell A will ultimately become the "top" subcell of the inverted metamorphic structure after completion of the process steps according to the present invention to be described hereinafter.

On top of the base layer 107 a back surface field ("BSF") layer 108 preferably p+ AlGaInP is deposited and used to reduce recombination loss.

The BSF layer 108 drives minority carriers from the region near the base/BSF interface surface to minimize the effect of recombination loss. In other words, a BSF layer 18 reduces recombination loss at the backside of the solar subcell A and thereby reduces the recombination in the base.

On top of the BSF layer 108 is deposited a sequence of heavily doped p-type and n-type layers 109a and 109b that forms a tunnel diode, i.e. an ohmic circuit element that connects subcell A to subcell B. Layer 109a is preferably composed of p++ AlGaAs, and layer 109b is preferably composed of n++ InGaP.

On top of the tunnel diode layers 109 a window layer 110 is deposited, preferably n+ InGaP. The advantage of utilizing InGaP as the material constituent of the window layer 110 is that it has an index of refraction that closely matches the adjacent emitter layer 111, as more fully described in U.S. patent application Ser. No. 12/258,190, filed Oct. 24, 2008. More generally, the window layer 110 used in the subcell B operates to reduce the interface recombination loss. It should be apparent to one skilled in the art, that additional layer(s) may be added or deleted in the cell structure without departing from the scope of the present invention.

On top of the window layer 110 the layers of subcell B are deposited: the n-type emitter layer 111 and the p-type base layer 112. These layers are preferably composed of InGaP and $In_{0.015}GaAs$ respectively (for a Ge substrate or growth template), or InGaP and GaAs respectively (for a GaAs substrate), although any other suitable materials consistent with lattice constant and bandgap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to some embodiments of the present invention will be discussed in conjunction with FIG. 21.

In previously disclosed implementations of an inverted metamorphic solar cell, the middle cell was a homostructure. In some embodiments of the present disclosure, similarly to the structure disclosed in U.S. patent application Ser. No. 12/023,772, the middle subcell becomes a heterostructure with an InGaP emitter and its window is converted from InAlP to InGaP. This modification eliminated the refractive index discontinuity at the window/emitter interface of the middle sub-cell. Moreover, the window layer 110 maybe doped three times that of the emitter 111 to move the Fermi level up closer to the conduction band and therefore create band bending at the window/emitter interface which results in constraining the minority carriers to the emitter layer.

In one of the embodiments of the present disclosure, the middle subcell emitter has a band gap equal to the top subcell emitter, and the bottom subcell emitter has a band gap greater than the band gap of the base of the middle subcell. Therefore, after fabrication of the solar cell, and implementation and operation, neither the emitters of middle subcell B nor the bottom subcell C will be exposed to absorbable radiation. Substantially all of the photons representing absorbable radiation will be absorbed in the bases of cells B and C, which have narrower band gaps than the respective emitters. In summary, the advantages of the embodiments using heterojunction subcells are: (i) the short wavelength response for both subcells are improved, and (ii) the bulk of the radiation is more effectively absorbed and collected in the narrower band gap base. The overall effect will be to increase the short circuit current $J_{sc}$.

On top of the cell B is deposited a BSF layer 113 which performs the same function as the BSF layer 109. The p++/n++ tunnel diode layers 114a and 114b respectively are deposited over the BSF layer 113, similar to the layers 109a and 109b, forming an ohmic circuit element to connect subcell B to subcell C. The layer 114a is preferably composed of p++ AlGaAs, and layer 114b is preferably composed of n++ InGaP.

In some embodiments, a "barrier" layer 115, preferably composed of n-type InGa(Al)P, is deposited over the tunnel diode 114a/114b, to a thickness from 0.25 to about 1.0 micron. Such barrier layer is intended to prevent threading dislocations from propagating, either opposite to the direction of growth into the middle and top subcells A and B, or in the direction of growth into the bottom subcell C. Examples are more particularly described in co-pending U.S. patent application Ser. No. 11/860,183, filed Sep. 24, 2007, which also refers to such layer as a "barrier" layer. Although the term "barrier layer" has previously been used by other researchers in the published literature for a variety of layers in a solar cell, the usage by Applicants in the earlier application and in the present application has a particular meaning that would be readily apparent to persons of ordinary skill in the field in view of the entire application. may have created certain ambiguity or unwarranted assumptions concerning the composition, function and/or effect of such layer. In particular, identifying such layer as a distinct "barrier" layer in this and previous applications signifies that the barrier layer has a different and distinct composition from the directly adjacent layers. Thus, the introduction of the "barrier" layer into a solar cell is a distinctive feature of U.S. patent application Ser. No. 11/860,183, and of the present disclosure. By placing such a layer in the designated position in the illustrated embodiments, the barrier layer will be characterized to have a function and effect which results in a demonstrable improvement in the performance or other characteristic of the solar cell in which it is implemented.

In utilizing the terminology "different and distinct composition" in the preceding paragraph, and throughout this disclosure, we mean, most generally, a layer with different constituent elements, or the same constituent elements in different proportions or mole fractions (which would result in different lattice constants for the two materials), or the same constituent elements with different dopants, dopant concentrations, or dopant profiles such that the operational characteristics of the different layers are distinct and different.

A metamorphic layer (or graded interlayer) 116 is deposited over the barrier layer 115 using, in some embodiments, a surfactant. In some embodiments the surfactant may be selenium. In some embodiments the surfactant selenium is introduced as a precursor gas of di-isopropyl selenide. In some embodiments, tellurium may be used as a surfactant/dopant in lieu of selenium. In those embodiments, tellurium is introduced as a precursor gas of diethyltellurium.

Layer 116 is referred to as a graded interlayer since in some embodiments it is preferably a compositionally step-graded series of InGaAlAs layers, preferably with monotonically changing lattice constant in each step, so as to achieve a gradual transition in lattice constant in the semiconductor structure from the lattice constant of subcell B to the lattice constant of subcell C while minimizing threading dislocations from occurring. In some embodiments, the band gap of layer 116 is constant throughout its thickness, preferably approximately equal to 1.5 eV, or otherwise consistent with a value slightly greater than the base bandgap of the middle subcell B. In some embodiments, the graded interlayer may be composed of $(In_xGa_{1-x})_yAl_{1-y}As$, with $0<x<1$, $0<y<1$, and the values of x and y selected for each respective layer such that the band gap of the entire interlayer remains constant at approximately 1.50 eV or other appropriate band gap over its thickness.

In an alternative embodiment where the solar cell has only two subcells, and the "middle" cell B is the uppermost or top subcell in the final solar cell, wherein the "top" subcell B would typically have a bandgap of 1.8 to 1.9 eV, then the band gap of the graded interlayer would remain constant at 1.9 eV.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different bandgap. In one of the preferred embodiments of the present invention, the layer 116 is composed of a plurality of layers of InGaAlAs, with monotonically changing lattice constant, each layer having the same bandgap, approximately 1.5 eV.

The advantage of utilizing a constant bandgap material such as InGaAlAs over a phosphide based material is that arsenide-based semiconductor material is much easier to process in standard commercial MOCVD reactors, compared to phosphide materials, while the small amount of aluminum provides a bandgap that assures radiation transparency of the metamorphic layers.

Although one of the preferred embodiments of the present disclosure utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Thus, the system of Wanlass using compositionally graded InGaP is a second embodiment of the present invention. Other embodiments of the present disclosure may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a bandgap energy greater than that of the second solar cell.

Since the present disclosure (and the related applications noted above) are directed to high volume manufacturing processes using metalorganic vapor phase epitaxy (MOVPE) reactors to form the solar cell epitaxial layers, a short discussion of some of the considerations associated with such processes and methods associated with the formation of the graded interlayer(s) are in order here.

First, it should be noted that the advantage of utilizing an interlayer material such as AlGaInAs is that arsenide-based semiconductor material is much easier to process from a manufacturing standpoint using present state-of-the-art high volume manufacturing metalorganic vapor phase epitaxy (MOVPE) reactors than either the AlGaInAsP, or GaInP compounds, or in general any material including phosphorus. Simply stated, the use of a III-V arsenide compound is much more desirable than a III-V phosphide compound from the perspectives of cost, ease of growth, reactor maintenance, waste handling and personal safety.

Figure 22:
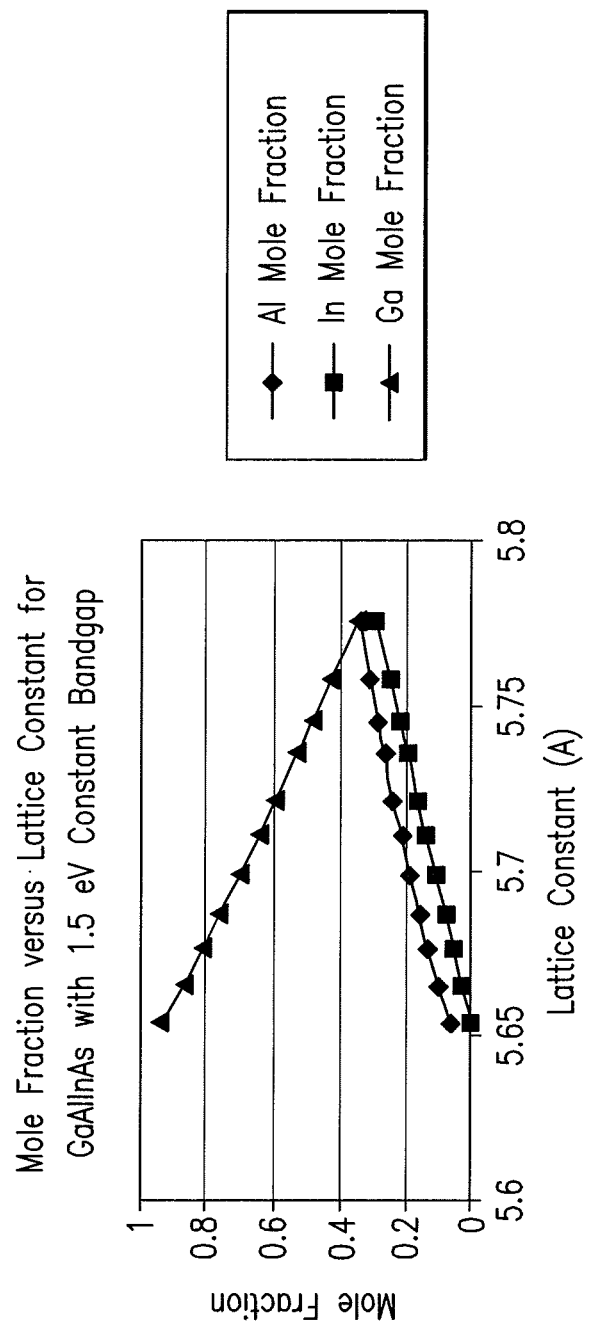
FIG. 22 is a graph representing the Al, Ga and In mole fractions versus the lattice constant in a AlGaInAs material system that is necessary to achieve a constant 1.5 eV band gap.
Figure 23:
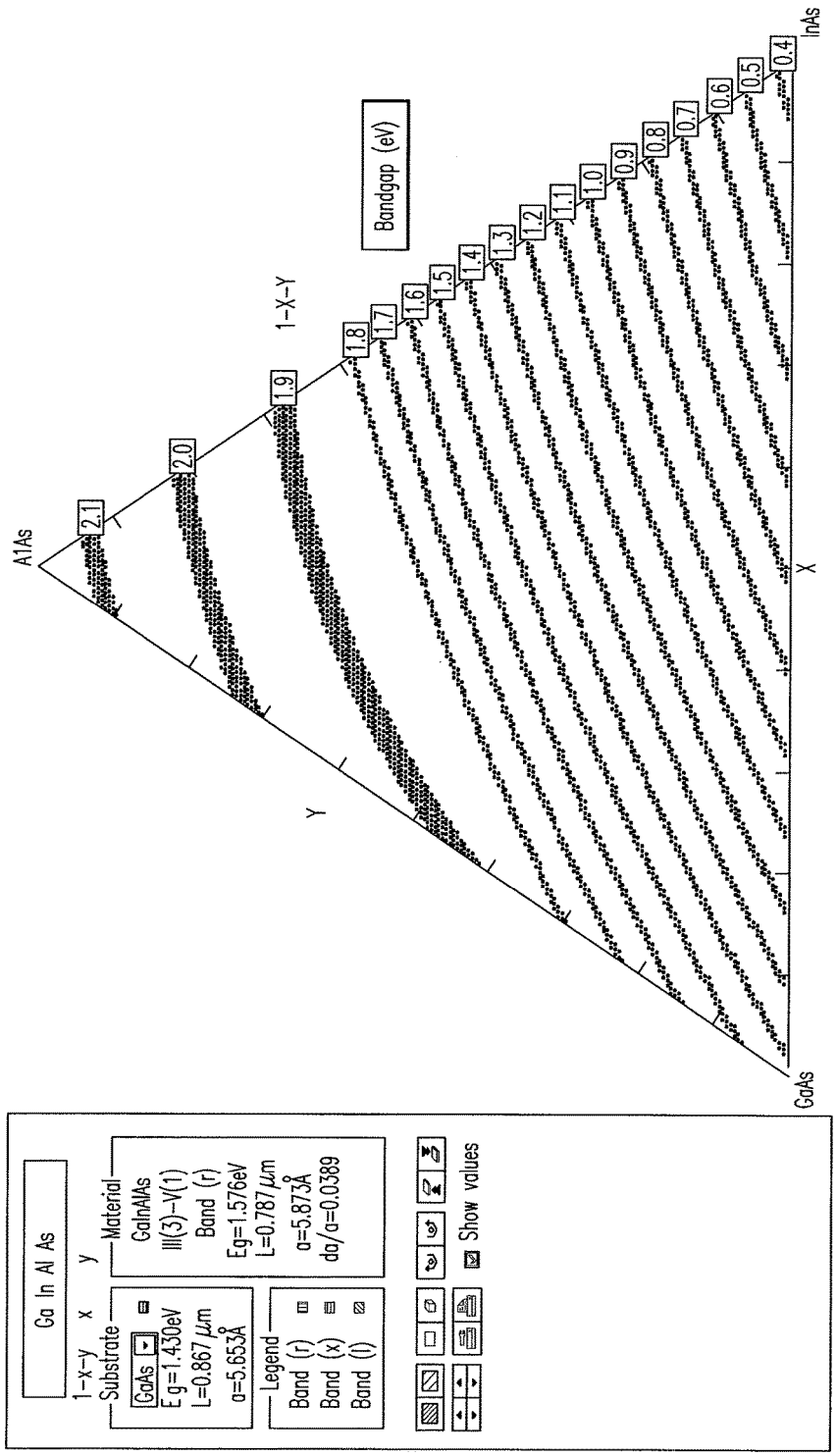
FIG. 23 is a diagram representing the relative concentration of Al, In, and Ga in an AlGaInAs material system needed to have a constant band gap with various designated values (ranging from 0.4 eV to 2.1 eV) as represented by curves on the diagram.

The fabrication of a step graded (or continuous graded) interlayer in an MOCVD process can be more explicitly described in a sequence of conceptual and operational steps which we describe here for pedagogical clarity. First, the appropriate band gap for the interlayer must be selected. In one of the disclosed embodiments, the desired constant band gap is 1.5 eV. Second, the most appropriate material system (i.e., the specific semiconductor elements to form a compound semiconductor alloy) must be identified. In the disclosed embodiment, these elements are Al, Ga, In, and As. Third, a computation must be made, for example using a computer program, to identify the class of compounds of $Al_y(Ga_xIn_{1-x})_{1-y}As$ with $0<x<1$, $0<y<1$, and specific x and y that have a band gap of 1.5 eV. An example of such a computer program output that provides a very rough indication of these compounds is illustrated in FIGS. 22 and 23. Fourth, based upon the lattice constants of the epitaxial layers adjoining the graded interlayer, a specification of the required lattice constants for the top surface of the interlayer (to match the adjacent semiconductor layer), and the bottom surface of the interlayer (to match the adjacent semiconductor layer) must be made. Fifth, based on the required lattice constants, the compounds of $Al_y(Ga_xIn_{1-x})_{1-y}As$ with $0<x<1$, $0<y<1$, for specific x and y that have a band gap of 1.5 eV, may be identified. Again, a computation must be made, and as an example, the data may be displayed in a graph such as FIG. 22 representing the Al, Ga and In mole fractions in a AlGaInAs material system that is necessary to achieve a constant 1.5 eV band gap. Assuming there is a small number (e.g. typically in the range of seven, eight, nine, ten, etc.) of steps or grades between the top surface and the bottom surface, and that the lattice constant difference between each step is made equal, the bold markings in FIG. 23 represent selected lattice constants for each successive sublayer in the interlayer, and the corresponding mole fraction of Al, Ga and In needed to achieve that lattice constant in that respective sublayer may be readily obtained by reference to the axes of the graph. Thus, based on an analysis of the data in FIGS. 22 and 23, the reactor may be programmed to introduce the appropriate quantities of precursor gases (as determined by flow rates at certain timed intervals) into the reactor so as to achieve a desired specific $Al_y(Ga_xIn_{1-x})_{1-y}As$ composition in that sublayer so that each successive sublayer maintains the constant band gap of 1.5 eV and a monotonically increasing lattice constant. The execution of this sequence of steps, with calculated and determinate precursor gas composition, flow rate, temperature, and reactor time to achieve the growth of a $Al_y(Ga_xIn_{1-x})_{1-y}As$ composition of the interlayer with the desired properties (lattice constant change over thickness, constant band gap over the entire thickness), in a repeatable, manufacturable process, is not to be minimalized or trivialized.

Although one embodiment of the present disclosure utilizes a plurality of layers of AlGaInAs for the metamorphic layer 116 for reasons of manufacturability and radiation transparency, other embodiments of the present disclosure may utilize different material systems to achieve a change in lattice constant from subcell B to subcell C. Other embodiments of the present disclosure may utilize continuously graded, as opposed to step graded, materials. More generally, the graded interlayer may be composed of any of the As, N, Sb based III-V compound semiconductors subject to the constraints of having the in-plane lattice parameter greater or equal to that of the second solar subcell and less than or equal to that of the third solar subcell, and having a band gap energy greater than that of the second solar subcell.

In another embodiment, an optional second barrier layer 117 may be deposited over the InGaAlAs metamorphic layer 116. The second barrier layer 117 will typically have a different composition than that of barrier layer 115, and performs essentially the same function of preventing threading dislocations from propagating. In one embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present invention.

On top of the window layer 118, the layers of cell C are deposited: the n+ emitter layer 119, and the p-type base layer 120. These layers are preferably composed of n+ type InGaAs and p type InGaAs respectively, or n+ type InGaP and p type InGaAs for a heterojunction subcell, although another suitable materials consistent with lattice constant and bandgap requirements may be used as well. The doping profile of layers 119 and 120 will be discussed in connection with FIG. 21.

A BSF layer 121, preferably composed of InGaAlAs, is then deposited on top of the cell C, the BSF layer performing the same function as the BSF layers 108 and 113.

Finally, in the embodiment of a three junction cell depicted in FIG. 4A, a high band gap contact layer 129, preferably composed of p++ type InGaAlAs, is deposited on the BSF layer 121.

It should be apparent to one skilled in the art, that additional layer(s) may be added or deleted in the cell structure without departing from the scope of the present invention.

Figure 4B:
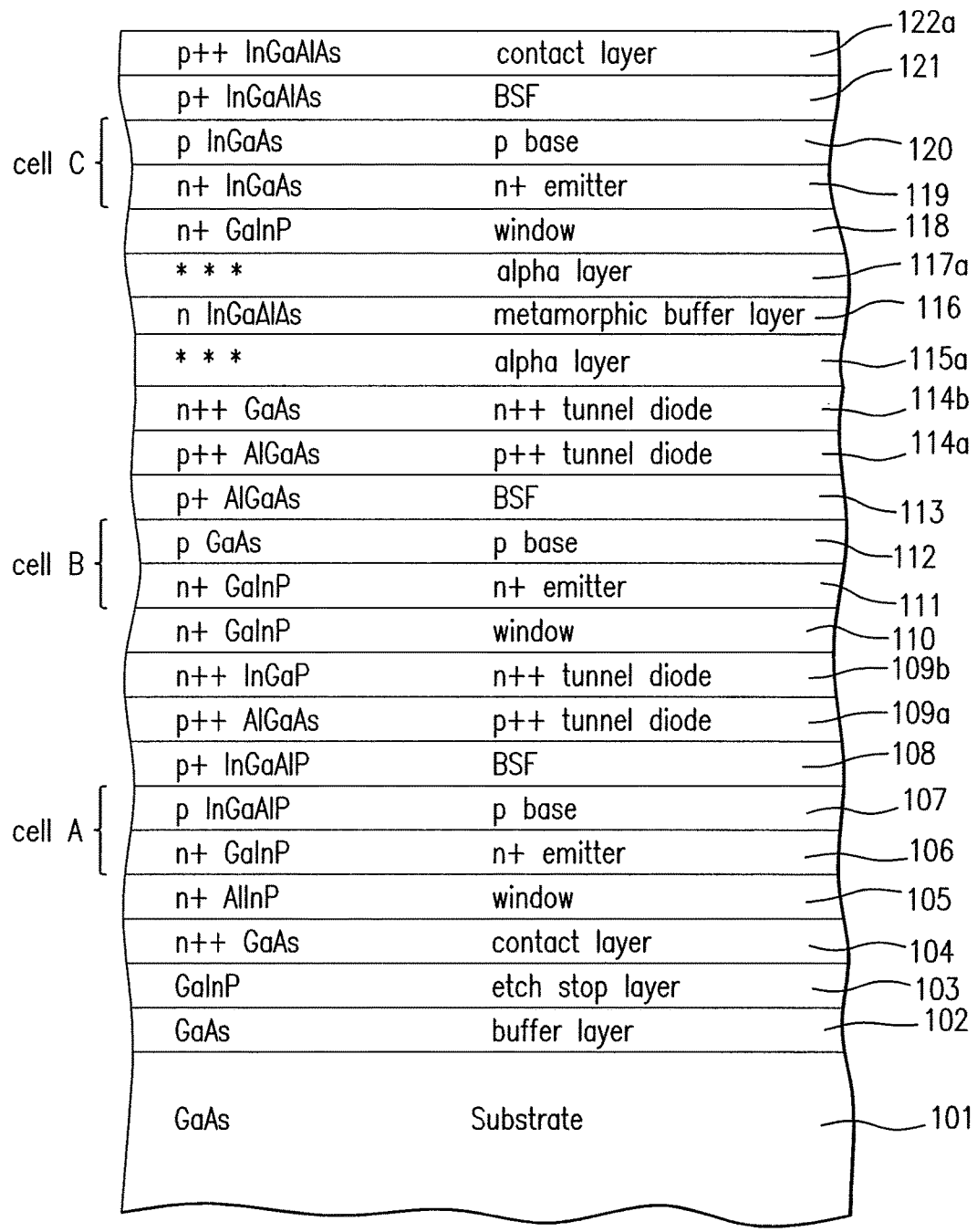
FIG. 4B is a cross-sectional view of a solar cell similar to that of FIG. 4A according to the present disclosure after the initial deposition of semiconductor layers on the growth substrate.

FIG. 4B depicts the three junction solar cell according to the present disclosure after the sequential formation of the three subcells A, B and C on a GaAs growth substrate. The layers 102 through 114b of this embodiment are substantially identical to those discussed in connection with the solar cell of FIG. 4A, and therefore in the interest of brevity of this disclosure, the description of such layers will not be repeated here.

On top of the n++ tunnel diode layer 114b an alpha layer 115a is deposited. In some embodiments, the alpha layer 115a is composed of any As, P, N, or Sb based III-V compound semiconductors having a band gap energy greater than or equal to that of the grading interlayer, and having a different composition from the adjacent tunnel diode 114b.

In some embodiments including the surfactant assisted growth of the alpha layer 115a according to the present disclosure, a suitable chemical element is introduced into the reactor during the growth of layer 115a to improve the surface characteristics of the layer. In the earlier parent application, in connection with a "barrier" layer, such element was suggested to be an isoelectronic surfactant such as bismuth (Bi) or antimony (Sb).

Surfactant assisted growth results in a much smoother or planarized surface. Since the surface topography affects the bulk properties of the semiconductor material as it grows and the layer becomes thicker, the use of the surfactants according to the present invention minimizes threading dislocations in the active regions, and therefore improves overall solar cell efficiency.

The term "isoelectronic" refers to surfactants such as antimony (Sb) or bismuth (Bi), since such elements have the same number of valence electrons as the P of InGaP, or as in InGaAlP, in the layer 115a. Such Sb or Bi surfactants will not typically be incorporated into the layer 115a.

In the present disclosure, it is proposed to utilize selenium as a surfactant/dopant during the growth of the alpha layer 115a. In some embodiments, the surfactant selenium is introduced as a precursor gas of di-isopropyl selenide. In some embodiments, tellurium may be used as a surfactant/dopant in lieu of selenium. In those embodiments, tellurium is introduced as a precursor gas of di-ethyl-tellurium or di-isopropyl-telluride.

In some embodiments, the alpha layer 115a is composed of GaInP. In some embodiments, the alpha layer 115a is between 0.2 and 0.5 microns in thickness and doped with selenium from $1.0 \times 10^{16}$ free carriers per cubic centimeter to $4.0 \times 10^{17}$ free carriers per cubic centimeter. In some embodiments, the alpha layer 115a is 0.2 microns in thickness. In some embodiments, the alpha layer 115a is 0.5 microns in thickness. In some embodiments, the selenium is introduced as a precursor gas of di-isopropyl-selenide. The selenium precursor acts as both a surfactant and as a dopant into the alpha layer.

In some embodiments, the alpha layer 115a has the same lattice constant as the adjoining tunnel diode layer 114b.

A metamorphic layer (or graded interlayer) 116 is deposited over the alpha layer 115a using, in some embodiments, a surfactant. In some embodiments the surfactant may be selenium. In some embodiments the surfactant selenium is introduced as a precursor gas of di-isopropyl selenide. In some embodiments, tellurium may be used as a surfactant/dopant in lieu of selenium. In those embodiments, tellurium is introduced as a precursor gas of diethyltellurium.

Other than the use of a surfactant during growth, the metamorphic layer 116 in this embodiment is substantially identical to those discussed in connection with solar cell of FIG. 4A, and therefore in the interest of brevity of this disclosure, the more detailed description of such layer will not be repeated here.

In another embodiment, an optional second alpha layer 117a may be deposited over the InGaAlAs metamorphic layer 116. The second alpha layer 117a will typically have a different composition than that of alpha layer 115a, and performs essentially the same function of preventing threading dislocations from propagating. In one embodiment, alpha layer 117a is n+ type GaInP.

In the present disclosure, it is proposed to utilize selenium as a surfactant/dopant during the growth of the alpha layer 117a. In some embodiments, the surfactant selenium is introduced as a precursor gas of di-isopropyl selenide. In some embodiments, tellurium may be used as a surfactant/dopant in lieu of selenium. In those embodiments, tellurium is introduced as a precursor gas of di-ethyl-tellurium or di-isopropyl-telluride.

The layers 118 through 129 of this embodiment are substantially identical to those discussed in connection with solar cell of FIG. 4A, and therefore in the interest of brevity of this disclosure, the description of such layers will not be repeated here.

The subsequent remaining steps in the fabrication of the triple junction solar cell according to the illustrated embodiments, including the deposition of metallization over the contact layer, and the attachment of a surrogate substrate, will be discussed and depicted at a later point in connection with FIG. 6 and subsequent Figures.

Figure 5:
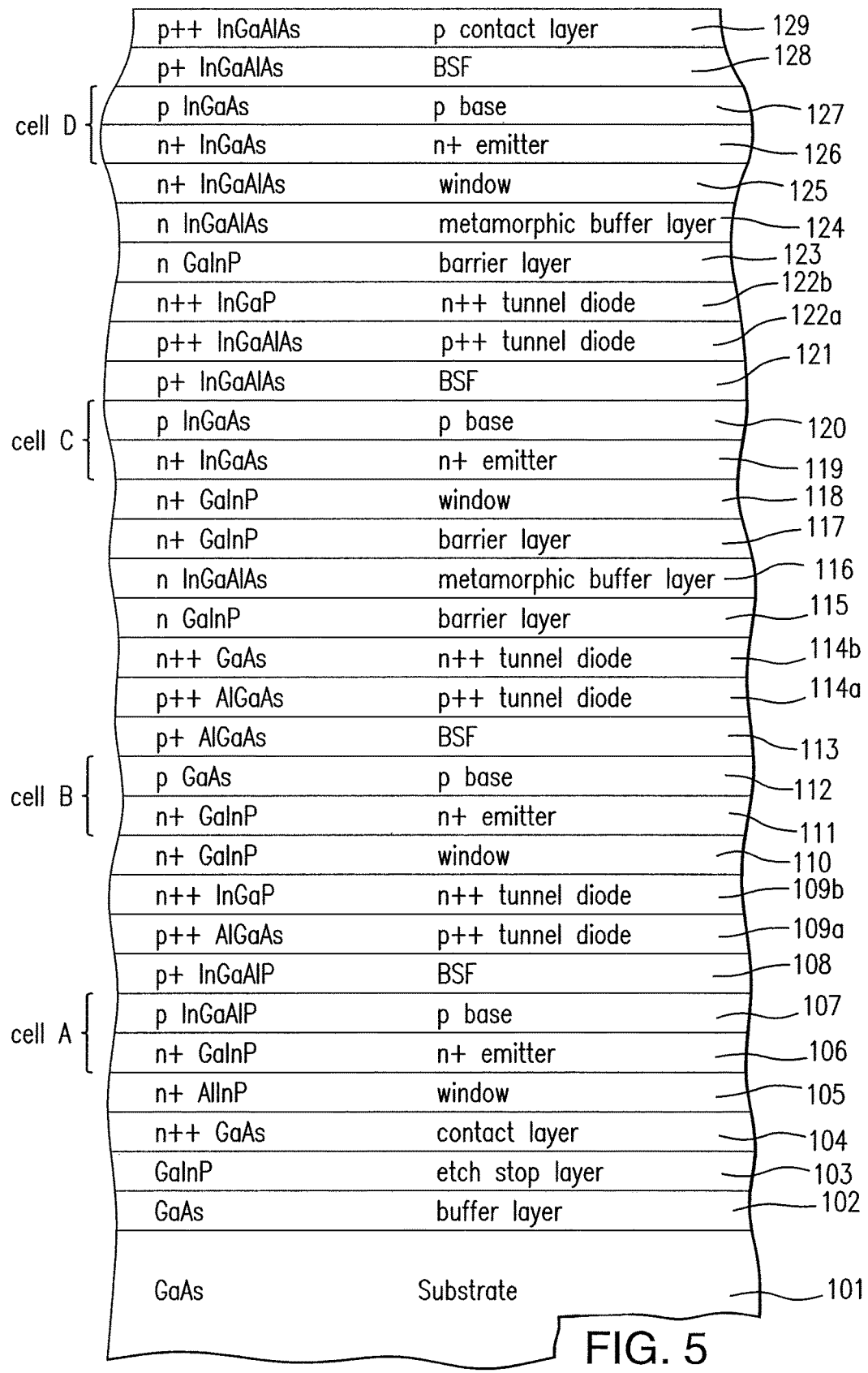
FIG. 5 is a cross-sectional view of a four junction solar cell after the initial deposition of semiconductor layers on the growth substrate.

FIG. 5 depicts a cross-sectional view of a four junction solar cell after the initial sequence of process steps substantially similar to that described and depicted in a number of the related applications noted above. The layers 102 through 121 of this embodiment of a solar cell are substantially identical to those discussed in connection with the embodiment of FIG. 4A, and therefore in the interest of brevity of this disclosure, the description of such layers will not be repeated here.

The p++/n++ tunnel diode layers 122a and 122b respectively of the solar cell of FIG. 5 are deposited over the BSF layer 121, similar to the layers 114a and 114b, forming an ohmic circuit element to connect subcell C to the fourth subcell D. The layer 122a is preferably composed of p++ InGaAlAs, and layer 122b is preferably composed of n++ InGaAlAs.

A barrier layer 123, preferably composed of n-type GaInP, is deposited over the tunnel diode 122a/122b, to a thickness of from 0.25 micron to about 1.0 micron. Such barrier layer is intended to prevent threading dislocations from propagating, either opposite to the direction of growth into the top and middle subcells A, B and C, or in the direction of growth into the subcell D, and is more particularly described in copending U.S. patent application Ser. No. 11/860,183, filed Sep. 24, 2007.

The discussion earlier in this disclosure pertaining to barrier layer 115 is also applicable to barrier layer 123, and need not be repeated here.

A metamorphic layer (or graded interlayer) 124 is deposited over the barrier layer 123. Layer 124 is preferably a compositionally step-graded series of InGaAlAs layers, preferably with monotonically changing lattice constant, so as to achieve a gradual transition in lattice constant in the semiconductor structure from subcell C to subcell D while minimizing threading dislocations from occurring. The band gap of layer 124 is constant throughout its thickness, preferably approximately equal to 1.1 eV, or otherwise consistent with a value slightly greater than the band gap of the middle subcell C. One embodiment of the graded interlayer may also be expressed as being composed of $(In_xGa_{1-y})_yAl_{1-y}As$, with $0<x<1$, $0<y<1$, and x and y selected such that the band gap of the interlayer remains constant at approximately 1.1 eV or other appropriate band gap.

A window layer 125 preferably composed of n+ type InGaAlAs is then deposited over layer 124 (or over a second barrier layer, if there is one, disposed over layer 124). This window layer operates to reduce the recombination loss in the fourth subcell "D". It should be apparent to one skilled in the art that additional layers may be added or deleted in the cell structure without departing from the scope of the present invention.

On top of the window layer 125, the layers of cell D are deposited: the n+ emitter layer 126, and the p-type base layer 127. These layers are preferably composed of n+ type GaInAs and p type GaInAs respectively, although other suitable materials consistent with lattice constant and band gap requirements may be used as well. The doping profile of layers 126 and 127 will be discussed in connection with FIG. 21.

A BSF layer 128, preferably composed of p+ type AlGaInAs, is then deposited on top of the cell D, the BSF layer performing the same function as the BSF layers 108, 113 and 121.

Finally a high band gap contact layer 129, preferably composed of p++ type AlGaInAs, is deposited on the BSF layer 128.

The composition of this contact layer 129 located at the bottom (non-illuminated) side of the lowest band gap photovoltaic cell (i.e., subcell "D" in the depicted embodiment) in a multijunction photovoltaic cell, can be formulated to increase absorption of the light that passes through the cell, so that (i) the backside ohmic metal contact layer below it (on the non-illuminated side) will also act as a mirror layer, and (ii) the contact layer doesn't have to be selectively etched off, to prevent absorption.

It should be apparent to one skilled in the art, that additional layer(s) may be added or deleted in the cell structure without departing from the scope of the present invention.

The subsequent remaining steps in the fabrication of the four junction solar cell according to the illustrated embodiments, including the deposition of metallization over the contact layer, and the attachment of a surrogate substrate, will be discussed and depicted at a later point in connection with FIG. 6 and subsequent Figures.

Figure 6A:
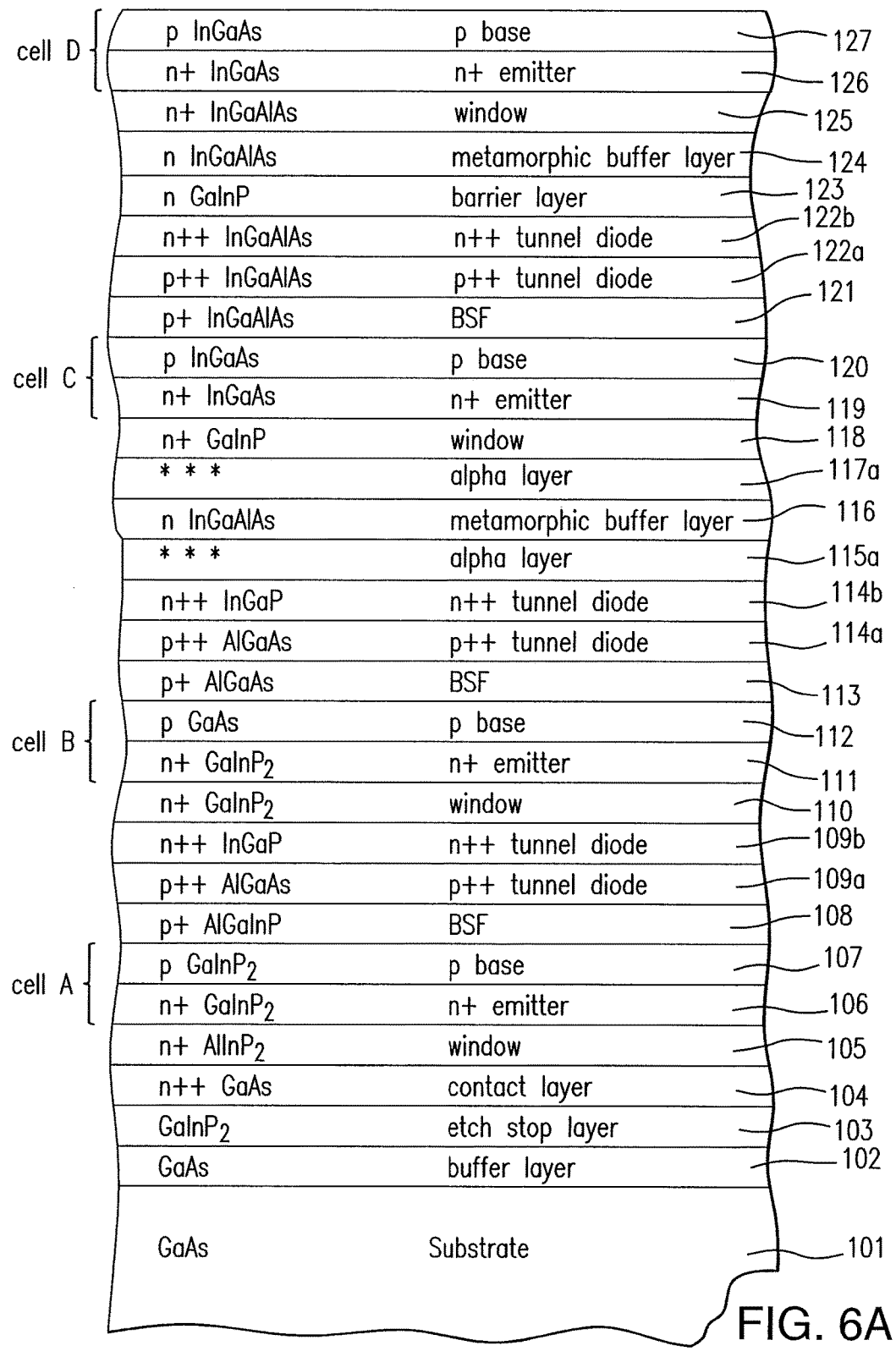
FIG. 6A is a cross-sectional view of a solar cell similar to that of FIG. 5 in a first embodiment according to the present disclosure.

FIG. 6A is a cross-sectional view of a solar cell similar to that of FIG. 5 according to the present disclosure after the deposition of additional semiconductor layers on the growth substrate. The layers 102 through 114b of this embodiment of a solar cell are substantially identical to those discussed in connection with the embodiment of FIG. 5, and therefore in the interest of brevity of this disclosure, the description of such layers will not be repeated here.

On top of the n++ tunnel diode layer 114b an alpha layer 115a is deposited. In some embodiments, the alpha layer 115a is composed of any As, P, N, or Sb based III-V compound semiconductors having a band gap energy greater than or equal to that of the grading interlayer, and having a different composition from the adjacent tunnel diode 114b, but the same lattice constant.

In some embodiments, the alpha layer 115a is composed of GaInP. In some embodiments, the alpha layer 115a is between 0.2 and 0.5 microns in thickness and doped with selenium from $1.0\times10^{16}$ free carriers per cubic centimeter to $4.0\times10^{17}$ free carriers per cubic centimeter. In some embodiments, the selenium is introduced as a precursor gas of di-isopropyl selenide. The selenium precursor acts as both a surfactant and as a dopant into the alpha layer.

A metamorphic layer (or graded interlayer) 116 is deposited over the alpha layer 115a using, in some embodiments, a surfactant. In the surfactant assisted growth of the metamorphic layer 116, a suitable chemical element is introduced into the reactor during the growth of layer 116 to improve the surface characteristics of the layer. In the one embodiment, such element may be a dopant or donor atom such as selenium (Se) or tellurium (Te). Small amounts of Se or Te are therefore incorporated in the metamorphic layer 116, and remain in the finished solar cell. In some embodiments, the selenium is introduced as a pre-cursor gas of di-isopropyl selenide. In some embodiments, tellurium may be used as a surfactant/dopant in lieu of selenium. In those embodiments, tellurium is introduced as a precursor gas of di-ethyl-tellurium or di-isopropyl-telluride. Although Se or Te are n-type dopant atoms, other non-isoelectronic surfactants may be used as well.

Other than the use of a surfactant during growth, the metamorphic layer 116 in this embodiment is substantially identical to those discussed in connection with solar cell of FIGS. 4A and 5, and therefore in the interest of brevity of this disclosure, the more detailed description of such layer will not be repeated here.

In another embodiment, an optional second alpha layer 117a may be deposited over the InGaAlAs metamorphic layer 116. The second alpha layer 117a will typically have a different composition than that of alpha layer 115a, and performs essentially the same function of preventing threading dislocations from propagating. In one embodiment, alpha layer 117a is n+ type GaInP.

In some embodiments, tellurium may be used as a surfactant/dopant in lieu of selenium in the first or second alpha layers, or in the first graded interlayer. In those embodiments, tellurium is introduced as a precursor gas of diethyltellurium or di-isopropyl telluride.

The layers 118 through 127 of this embodiment of a solar cell are substantially identical to those discussed in connection with the embodiment of FIG. 5, and therefore in the interest of brevity of this disclosure, the description of such layers will not be repeated here.

It should be apparent to one skilled in the art, that additional layer(s) may be added or deleted in the cell structure without departing from the scope of the present disclosure.

Figure 6B:
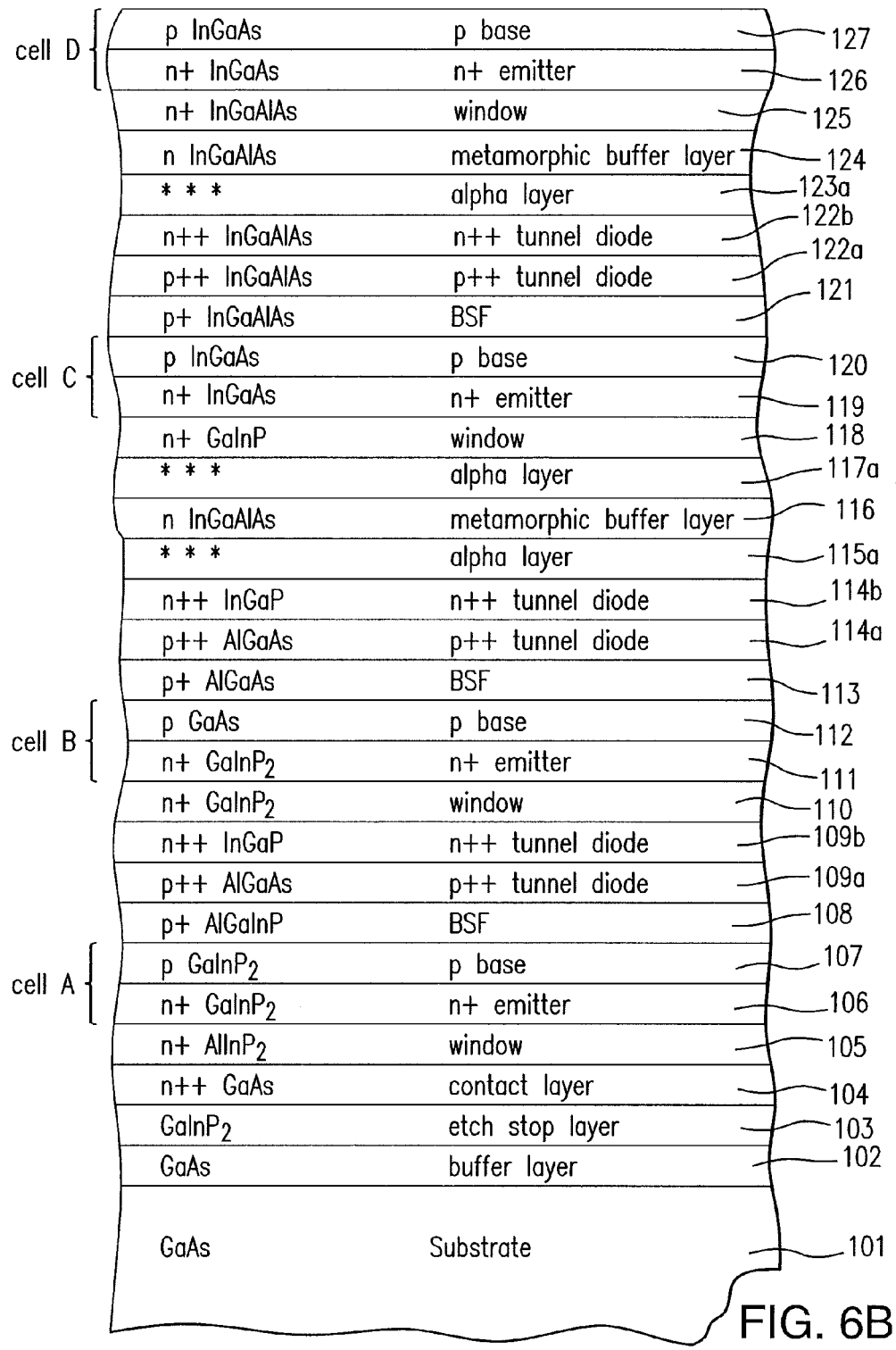
FIG. 6B is a cross-sectional view of a solar cell similar to that of FIG. 5 in a second embodiment according to the present disclosure.

FIG. 6B is a cross-sectional view of a solar cell similar to that of FIG. 6A according to the present disclosure in another embodiment. The layers 102 through 122b of this embodiment of a solar cell are substantially identical to those discussed in connection with the embodiment of FIG. 6A, and therefore in the interest of brevity of this disclosure, the description of such layers will not be repeated here.

In this embodiment, on top of the n++ tunnel diode layer 122b an alpha layer 123a is deposited. In some embodiments, the alpha layer 123a is composed of any As, P, N, or Sb based III-V compound semiconductors having a band gap energy greater than or equal to that of the grading interlayer, and having a different composition from the adjacent tunnel diode 122b, but substantially the same lattice constant.

In some embodiments, the alpha layer 123a is composed of GaInP. In some embodiments, the alpha layer 123a is between 0.2 and 0.5 microns in thickness and doped with selenium from $1.0 \times 10^{16}$ free carriers per cubic centimeter to $4.0 \times 10^{17}$ free carriers per cubic centimeter. In some embodiments, the selenium is introduced as a precursor gas of di-isopropyl selenide. The selenium precursor acts as both a surfactant and as a dopant into the alpha layer.

In some embodiments, tellurium may be used as a surfactant/dopant in lieu of selenium in the alpha layer 123a. In those embodiments, tellurium is introduced as a precursor gas of diethyltellurium or di-isopropyl telluride.

A metamorphic layer (or graded interlayer) 124 is deposited over the alpha layer 123a using, in some embodiments, a surfactant. In the surfactant assisted growth of the metamorphic layer 124, a suitable chemical element is introduced into the reactor during the growth of layer 124 to improve the surface characteristics of the layer. In the one embodiment, such element may be a dopant or donor atom such as selenium (Se) or tellurium (Te). Small amounts of Se or Te are therefore incorporated in the metamorphic layer 124, and remain in the finished solar cell. In some embodiments, the selenium is introduced as a pre-cursor gas of di-isopropyl selenide. In some embodiments, tellurium may be used as a surfactant/dopant in lieu of selenium. In those embodiments, tellurium is introduced as a precursor gas of di-ethyl-tellurium or di-isopropyl-telluride. Although Se or Te are n-type dopant atoms, other non-isoelectronic surfactants may be used as well.

Other than the use of a surfactant during growth, the metamorphic layer 124 in this embodiment is substantially identical to those discussed in connection with solar cell of FIGS. 4A and 5, and therefore in the interest of brevity of this disclosure, the more detailed description of such layer will not be repeated here.

In some embodiments, tellurium may be used as a surfactant/dopant in lieu of selenium in the first or second alpha layers, or in the first graded interlayer. In those embodiments, tellurium is introduced as a precursor gas of diethyltellurium or di-isopropyl telluride.

The layers 125 through 127 of this embodiment of a solar cell are substantially identical to those discussed in connection with the embodiment of FIG. 6A, and therefore in the interest of brevity of this disclosure, the description of such layers will not be repeated here.

It should be apparent to one skilled in the art, that additional layer(s) may be added or deleted in the cell structure without departing from the scope of the present disclosure.

Figure 7:
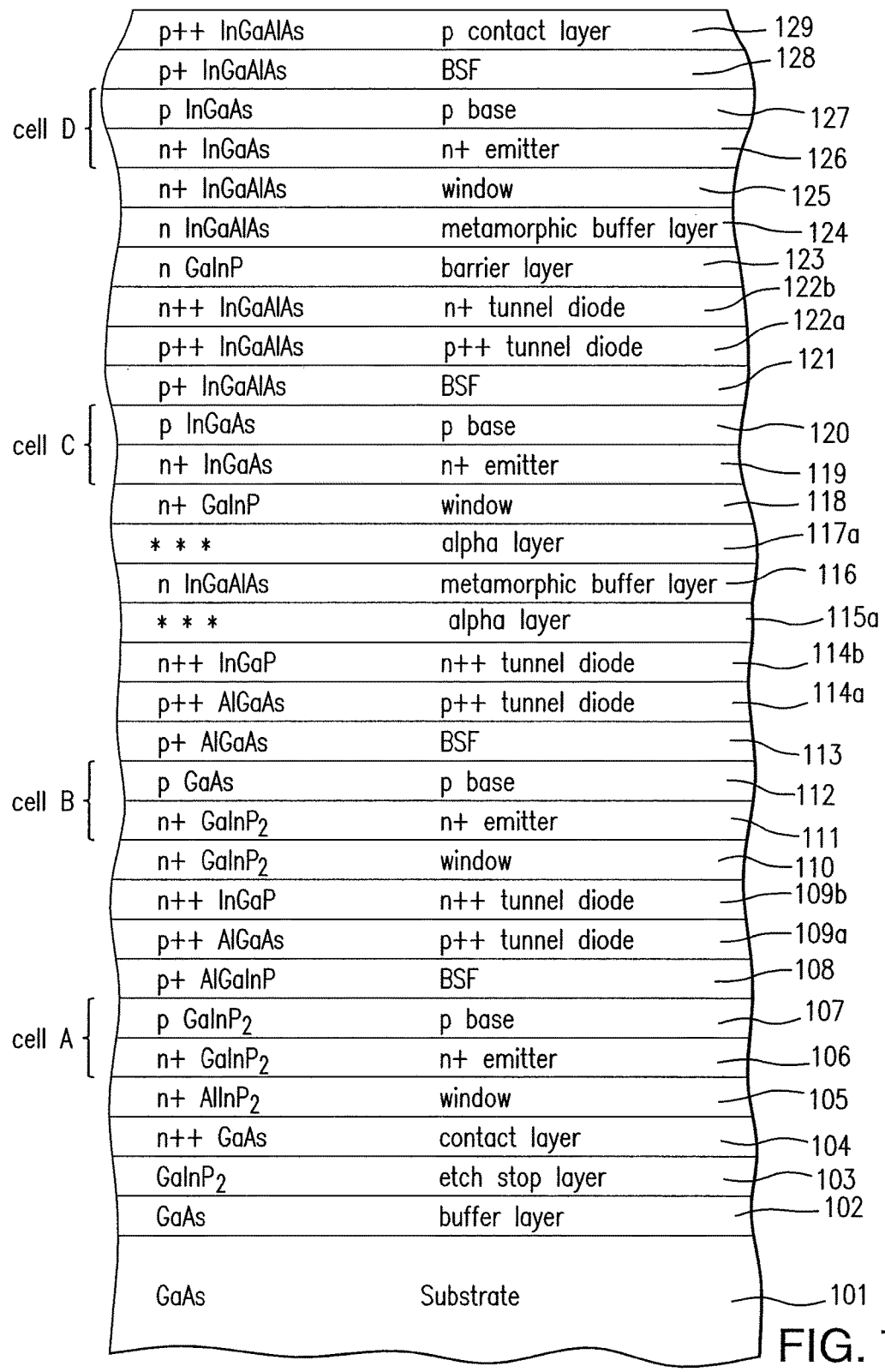
FIG. 7 is a cross-sectional view of the solar cell of FIG. 6 after the next process step.

FIG. 7 is a cross-sectional view of the solar cell of FIG. 6A or 6B according to the present disclosure after the deposition of additional semiconductor layers on the growth substrate. BSF layer 128, preferably composed of p+ type InGaAlAs, is then deposited on top of the cell D, the BSF layer performing the same function as the BSF layers 108, 113 and 121.

Finally a high band gap contact layer 129, preferably composed of p++ type InGaAlAs, is deposited on the BSF layer 128.

Similar to the contact layer 129 in FIG. 5, the composition of this contact layer 129 located at the bottom (non-illuminated) side of the lowest band gap photovoltaic cell (i.e., subcell "D" in the depicted embodiment) in a multijunction photovoltaic cell, can be formulated to increase absorption of the light that passes through the cell, so that (i) the backside ohmic metal contact layer below it (on the non-illuminated side) will also act as a mirror layer, and (ii) the contact layer doesn't have to be selectively etched off, to prevent absorption.

It should be apparent to one skilled in the art, that additional layer(s) may be added or deleted in the cell structure without departing from the scope of the present invention.

Figure 8:
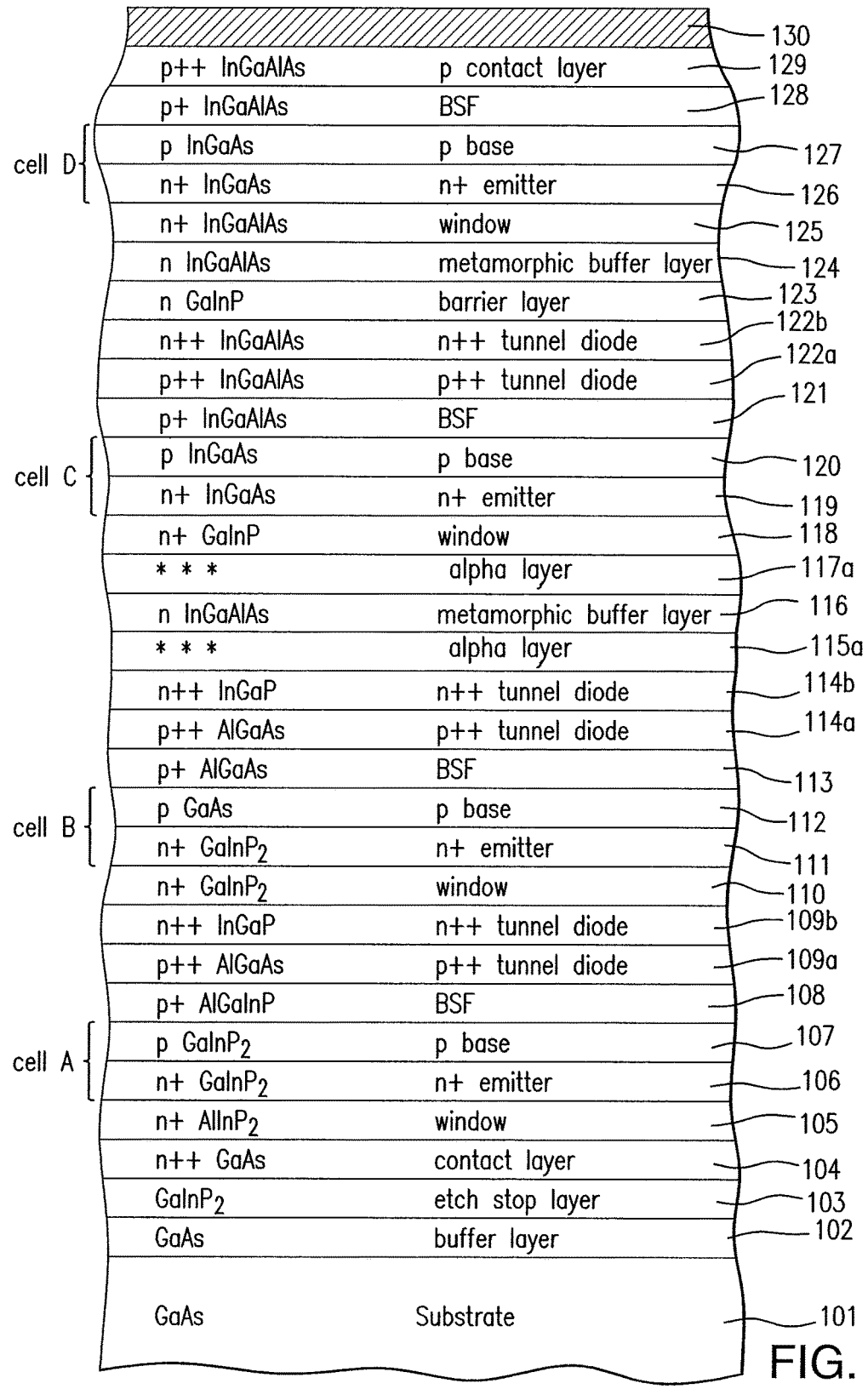
FIG. 8 is a cross-sectional view of the solar cell of FIG. 7 after the next process step.

FIG. 8 is a cross-sectional view of the solar cell of FIG. 7 after the next process step in which a metal contact layer 130 is deposited over the p+ semiconductor contact layer 129. The metal is the sequence of metal layers Ti/Au/Ag/Au.

Also, the metal contact scheme chosen is one that has a planar interface with the semiconductor, after heat treatment to activate the ohmic contact. This is done so that (1) a dielectric layer separating the metal from the semiconductor doesn't have to be deposited and selectively etched in the metal contact areas; and (2) the contact layer is specularly reflective over the wavelength range of interest.

Figure 9:
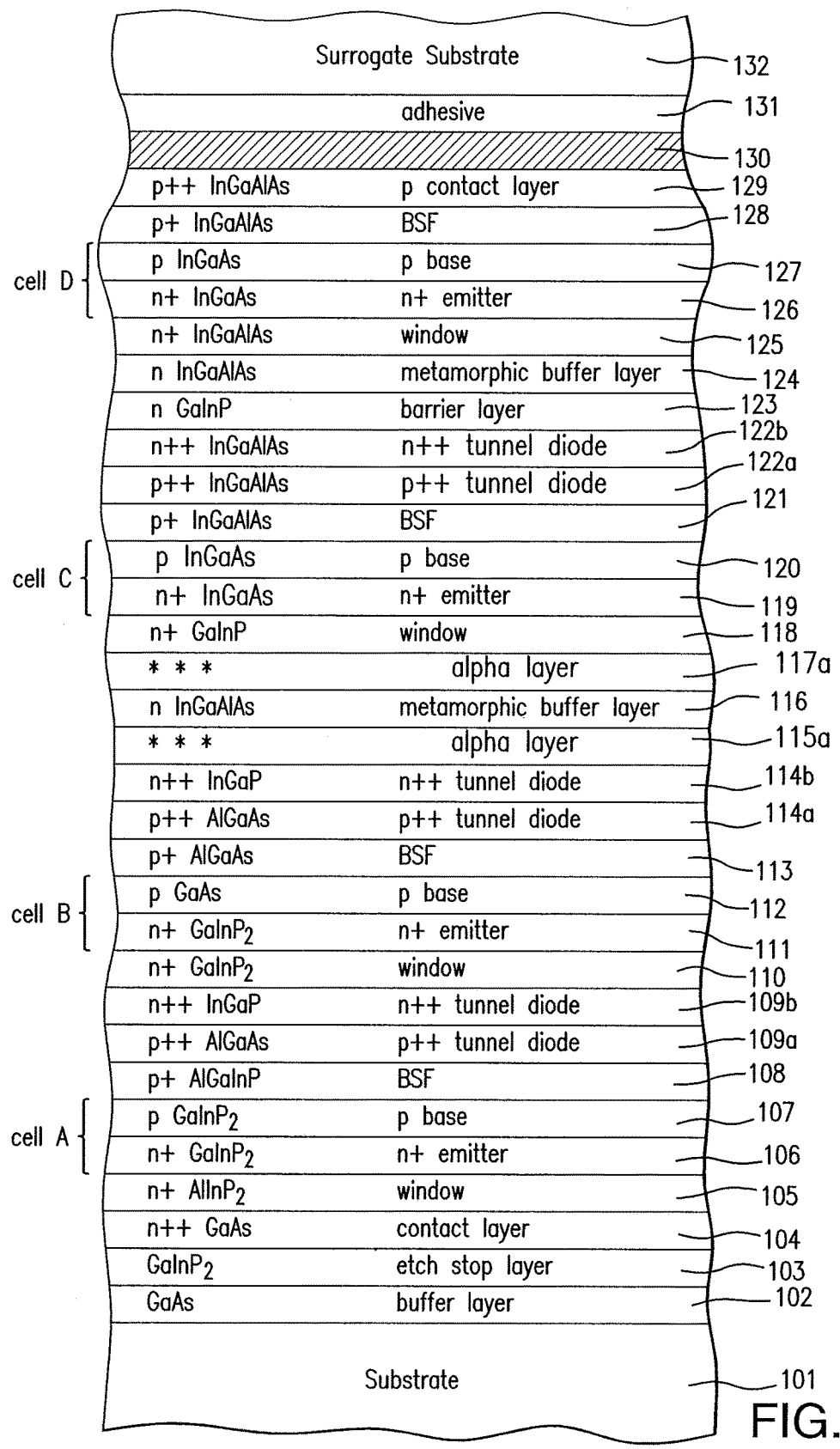
FIG. 9 is a cross-sectional view of the solar cell of FIG. 8 after the next process step in which a surrogate substrate is attached.

FIG. 9 is a cross-sectional view of the solar cell of FIG. 8 after the next process step in which an adhesive layer 131 is deposited over the metal layer 130. The adhesive is preferably Wafer Bond (manufactured by Brewer Science, Inc. of Rolla, Mo.).

In the next process step, a surrogate substrate 132, preferably sapphire, is attached. Alternative, the surrogate substrate may be glass, GaAs, Ge or Si, or other suitable material. The surrogate substrate is about 40 mils in thickness, and is perforated with holes about 1 mm in diameter, spaced 4 mm apart, to aid in subsequent removal of the adhesive and the substrate. As an alternative to using an adhesive layer 131, a suitable substrate (e.g., GaAs) may be eutectically or permanently bonded to the metal layer 130.

Figure 10A:
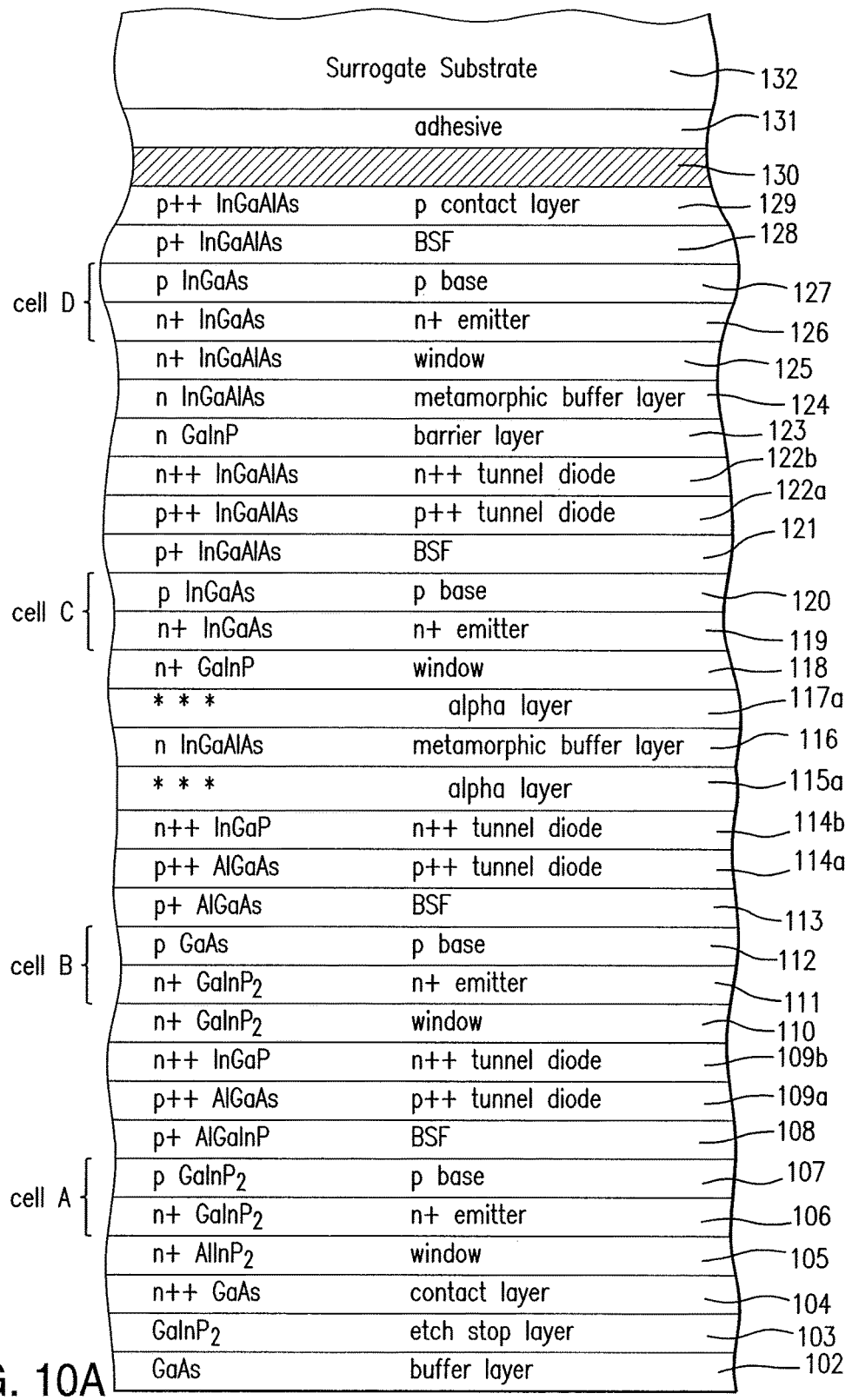
FIG. 10A is a cross-sectional view of the solar cell of FIG. 9 after the next process step in which the original substrate is removed.

FIG. 10A is a cross-sectional view of the solar cell of FIG. 9 after the next process step in which the original substrate 101 is removed by a sequence of grinding and/or etching steps in which the substrate 102, and the buffer layer 103 are removed. The choice of a particular etchant is growth substrate dependent.

Figure 10B:
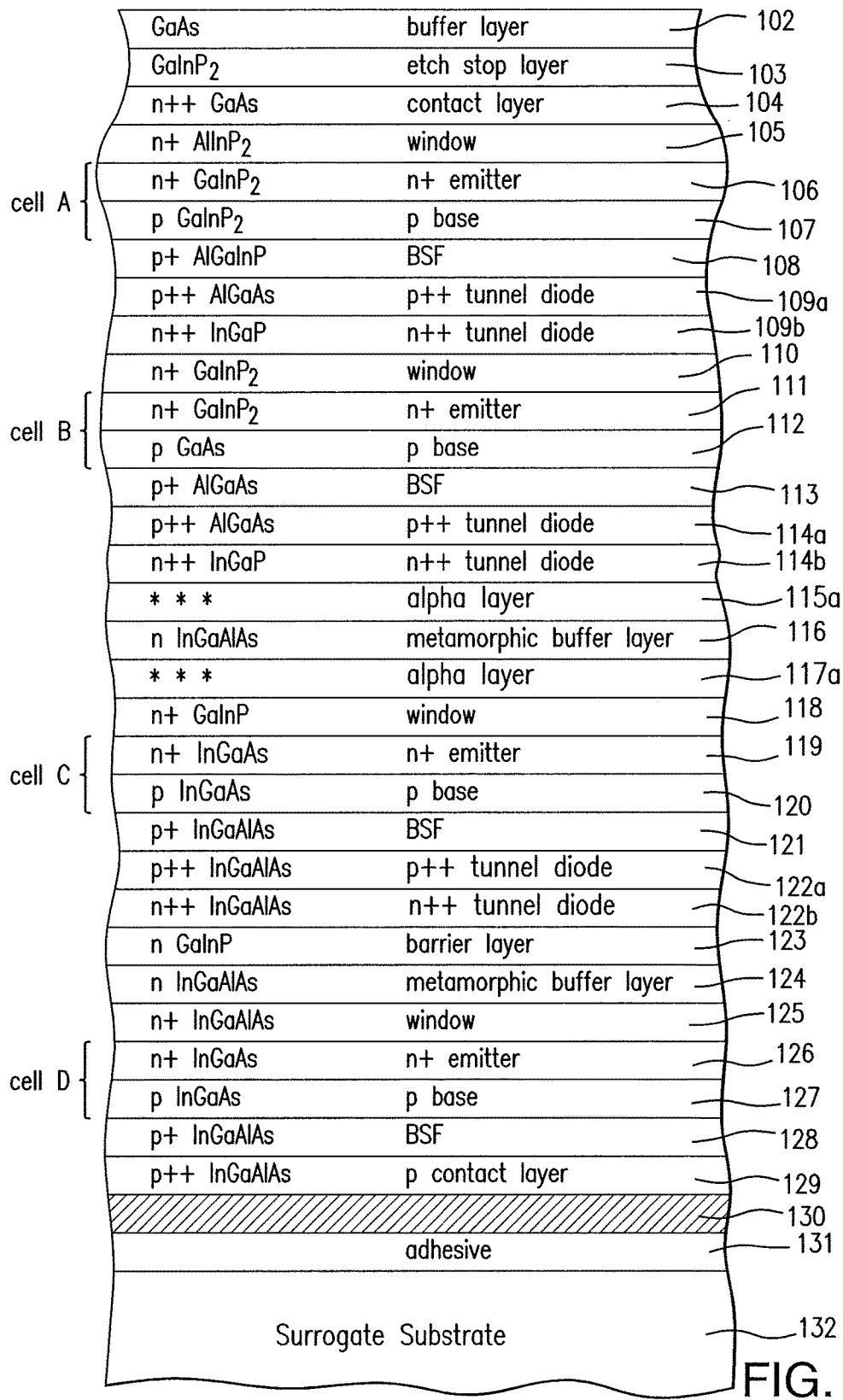
FIG. 10B is another cross-sectional view of the solar cell of FIG. 1 OA with the surrogate substrate on the bottom of the Figure.

FIG. 10B is a cross-sectional view of the solar cell of FIG. 10A with the orientation with the surrogate substrate 132 being at the bottom of the Figure. Subsequent Figures in this application will assume such orientation.

Figure 11:
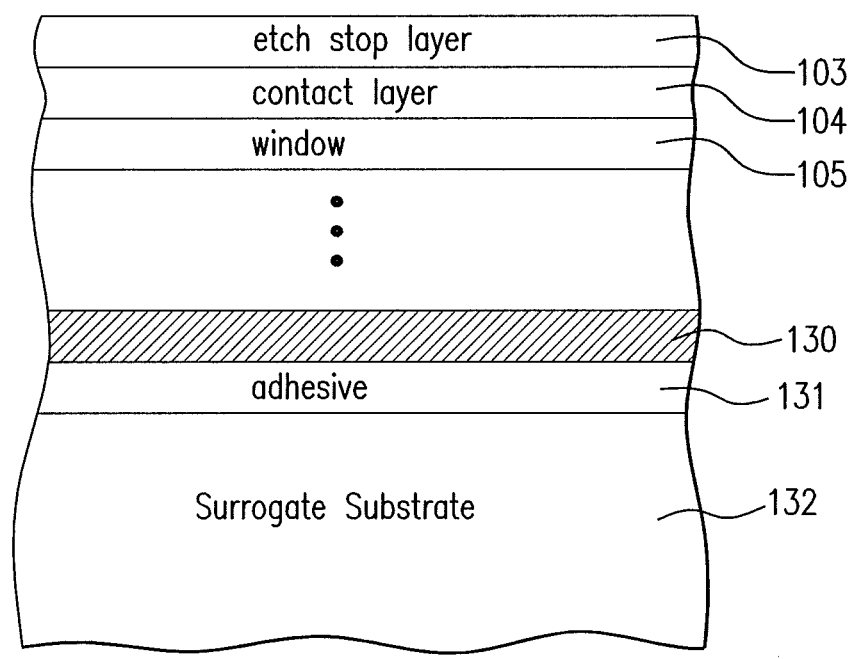
FIG. 11 is a simplified cross-sectional view of the solar cell of FIG. 10B after the next process step.

FIG. 11 is a simplified cross-sectional view of the solar cell of FIG. 10B depicting just a few of the top layers and lower layers over the surrogate substrate 132, after removal of the buffer layer 102.

Figure 12:
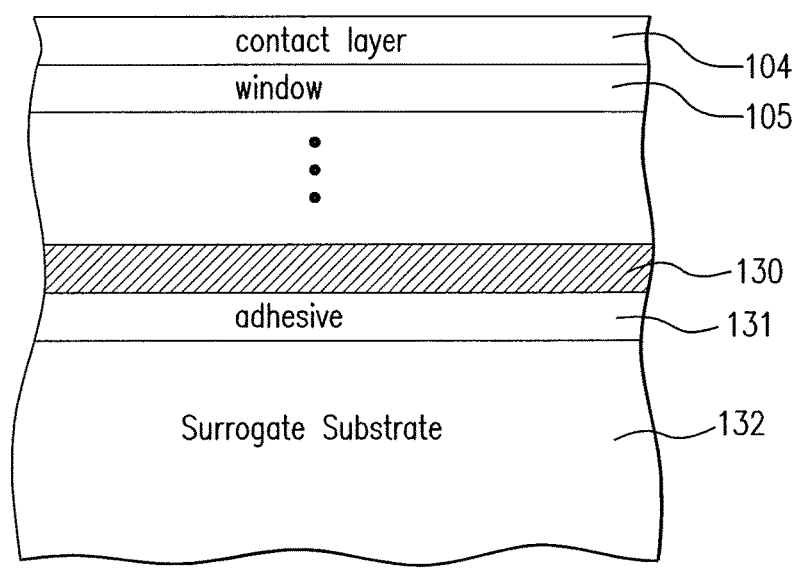
FIG. 12 is a cross-sectional view of the solar cell of FIG. 11 after the next process step.

FIG. 12 is a cross-sectional view of the solar cell of FIG. 11 after the next process step in which the etch stop layer 103 is removed by a HCl/H$_2$O solution.

Figure 13:
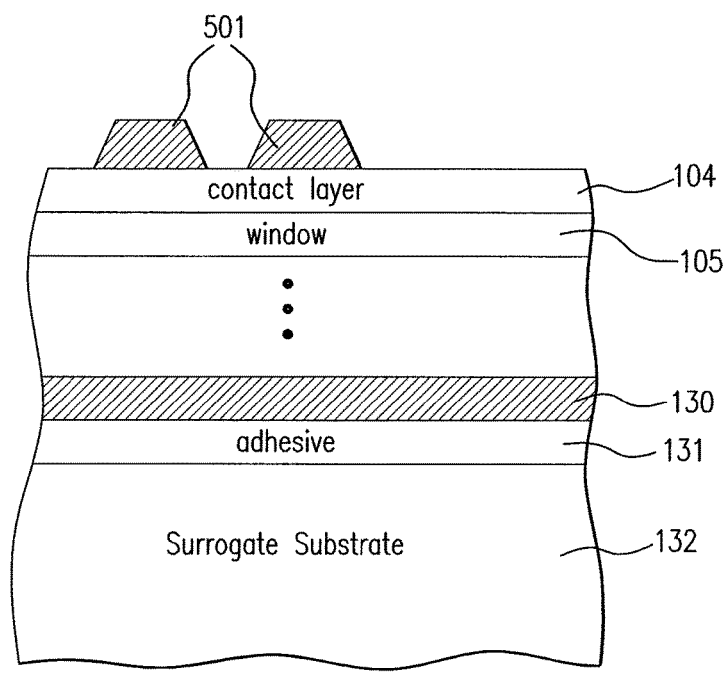
FIG. 13 is a cross-sectional view of the solar cell of FIG. 12 after the next process step.

FIG. 13 is a cross-sectional view of the solar cell of FIG. 12 after the next sequence of process steps in which a photoresist mask (not shown) is placed over the contact layer 104 to form the grid lines 501. As will be described in greater detail below, the grid lines 501 are deposited via evaporation and lithographically patterned and deposited over the contact layer 104. The mask is subsequently lifted off to form the finished metal grid lines 501 as depicted in the Figures.

As more fully described in U.S. patent application Ser. No. 12/218,582 filed Jul. 18, 2008, hereby incorporated by reference, the grid lines 501 are preferably composed of the sequence of layers Pd/Ge/Ti/Pd/Au, although other suitable sequences and materials may be used as well.

Figure 14:
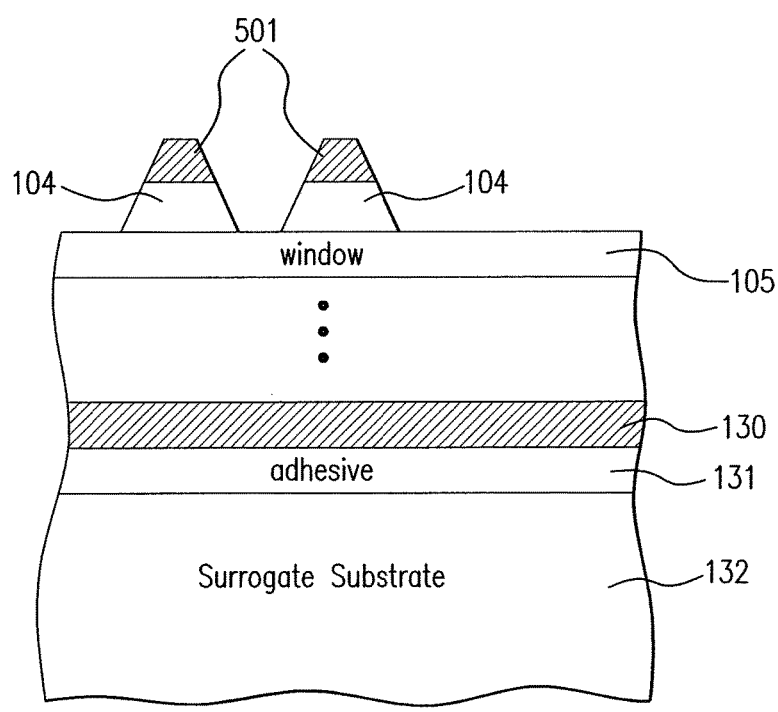
FIG. 14 is a cross-sectional view of the solar cell of FIG. 13 after the next process step.

FIG. 14 is a cross-sectional view of the solar cell of FIG. 13 after the next process step in which the grid lines are used as a mask to etch down the surface to the window layer 105 using a citric acid/peroxide etching mixture.

Figure 15A:
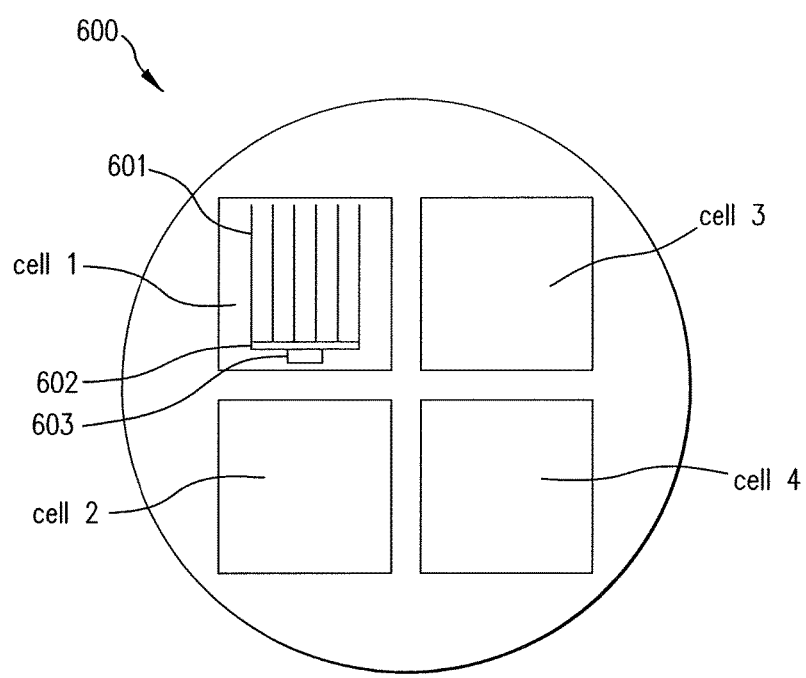
FIG. 15A is a top plan view of a wafer in which four solar cells are fabricated.

FIG. 15A is a top plan view of a 100 mm (or 4 inch) wafer 600 in which four solar cells are implemented. The depiction of four cells is for illustration for purposes only, and the present invention is not limited to any specific number of cells per wafer.

In each cell there are grid lines 601 (more particularly shown in cross-section in FIG. 14), an interconnecting bus line 602, and a contact pad 603. The geometry and number of grid and bus lines and the contact pad are illustrative and the present invention is not limited to the illustrated embodiment.

Figure 15B:
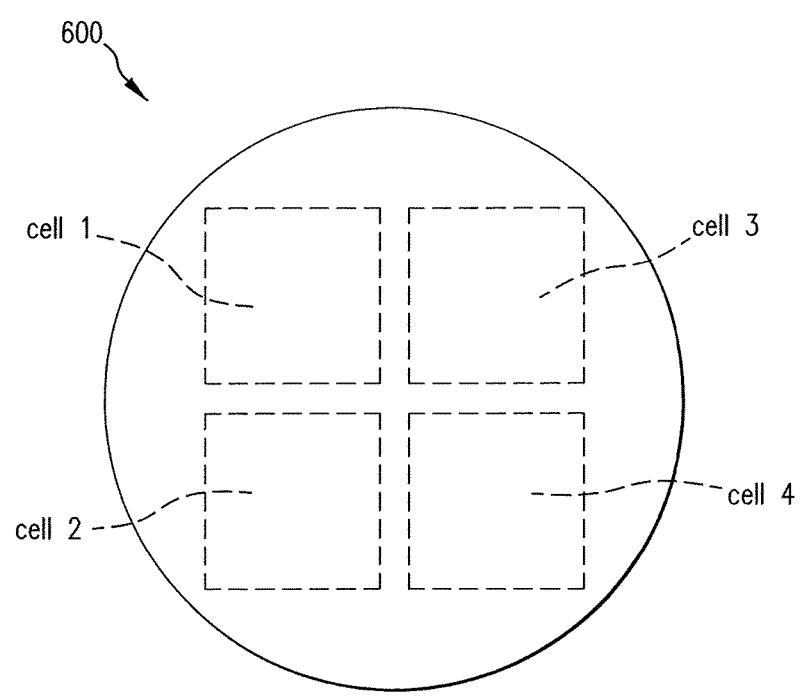
FIG. 15B is a bottom plan view of the wafer in which the four solar cells are fabricated.

FIG. 15B is a bottom plan view of the wafer of FIG. 15A in which the four solar cells are fabricated, with the location of the cells shown in dotted lines.

Figure 16:
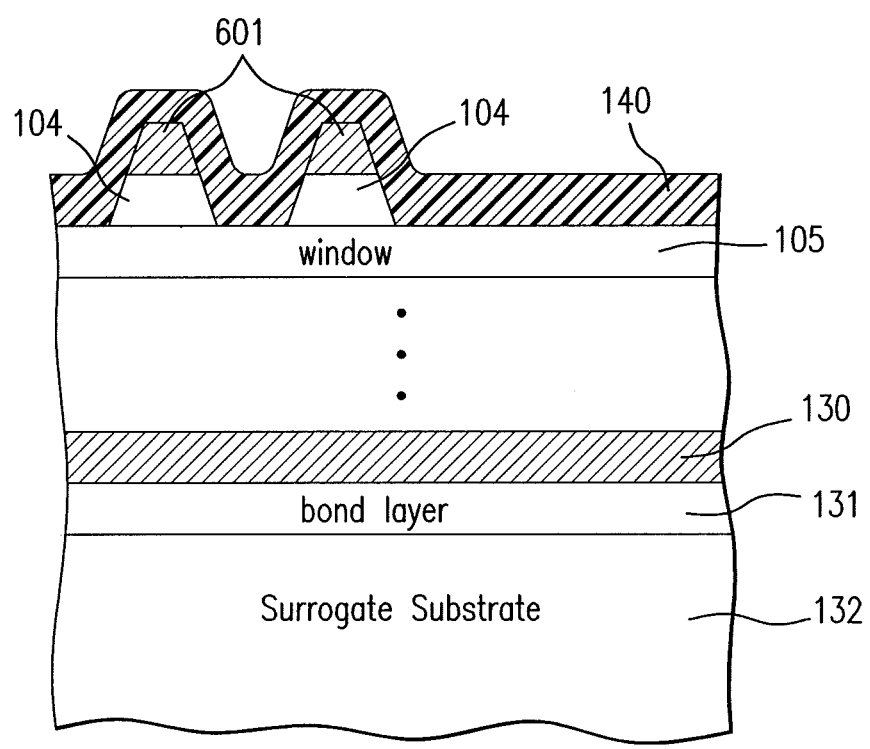
FIG. 16 is a cross-sectional view of the solar cell of FIG. 14 after the next process step.

FIG. 16 is a cross-sectional view of the solar cell of FIG. 14 after the next process step in which an antireflective (ARC) dielectric coating layer 140 is applied over the entire surface of the "top" side of the wafer with the grid lines 601.

Figure 17:
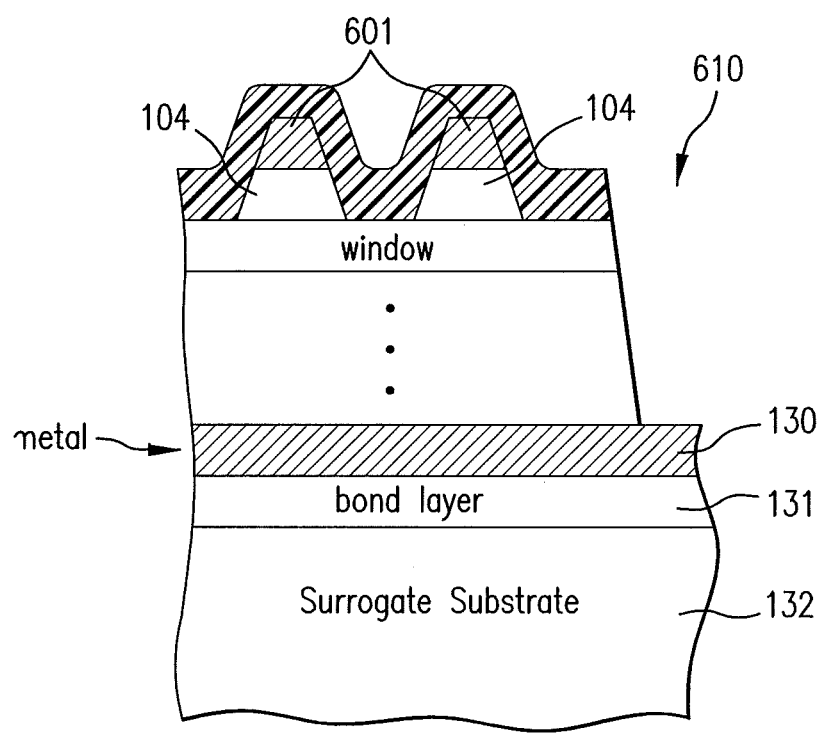
FIG. 17 is a cross-sectional view of the solar cell of FIG. 16 after the next process step, in a view orthogonal to the grid lines.

FIG. 17 is a cross-sectional view of the solar cell of FIG. 16 after the next process step according to some embodiments of the present invention in an annular channel 610, or portion of the semiconductor structure are etched down to the metal layer 130 using phosphide and arsenide etchants. This channel 610 defines a peripheral boundary between the cell and the rest of the wafer, and leaves a mesa structure which constitutes the solar cell, such as the configurations shown in FIGS. 1A and 1B.

Figure 18:
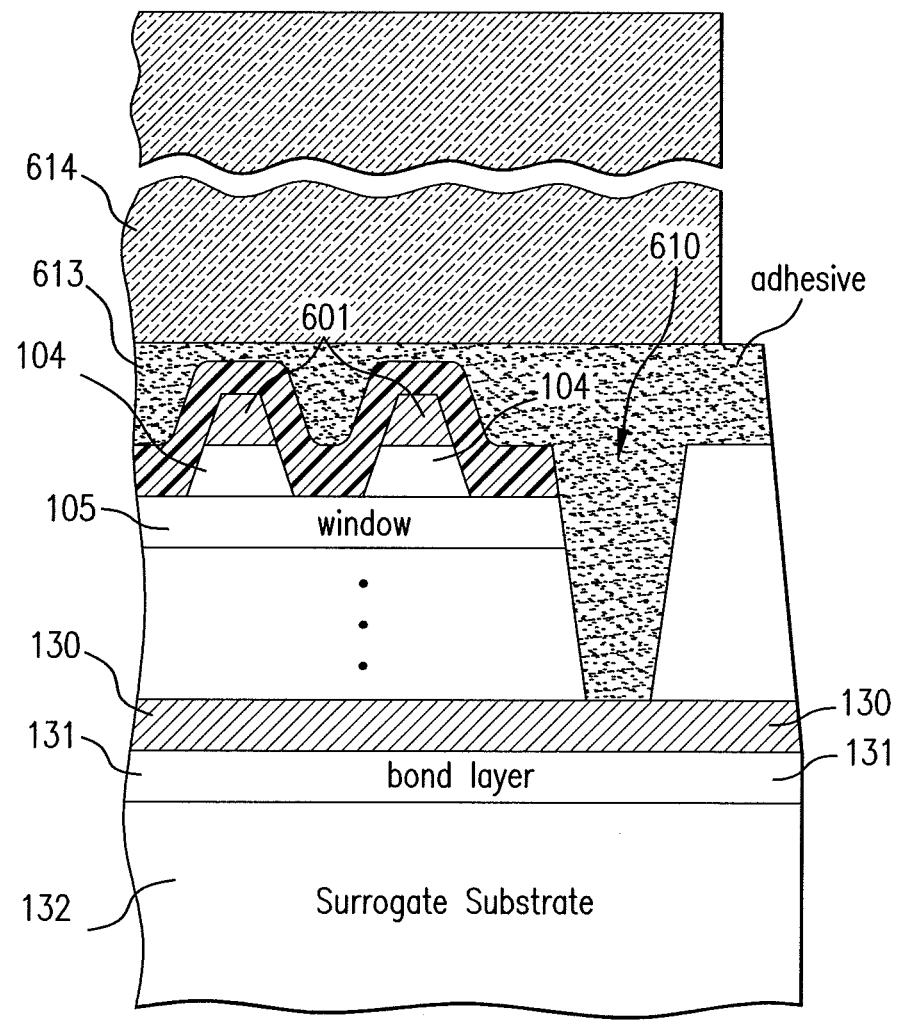
FIG. 18 is a cross-sectional view of the solar cell of FIG. 14A after the next process step in an embodiment of the present invention in which a cover glass in employed and the solar cell remains on the surrogate substrate.

FIG. 18 is a cross-sectional view of the solar cell of FIG. 17 after the next process step in one embodiment of the present disclosure in which a cover glass 614 is secured to the top of the cell by an adhesive 613. The cover glass 614 is typically about 4 mils thick. Although the use of a cover glass is desirable for many environmental conditions and applications, it is not necessary for all implementations, and additional layers or structures may also be utilized for providing additional support or environmental protection to the solar cell. The surrogate substrate 132 in some embodiments may also be composed of glass.

Figure 19:
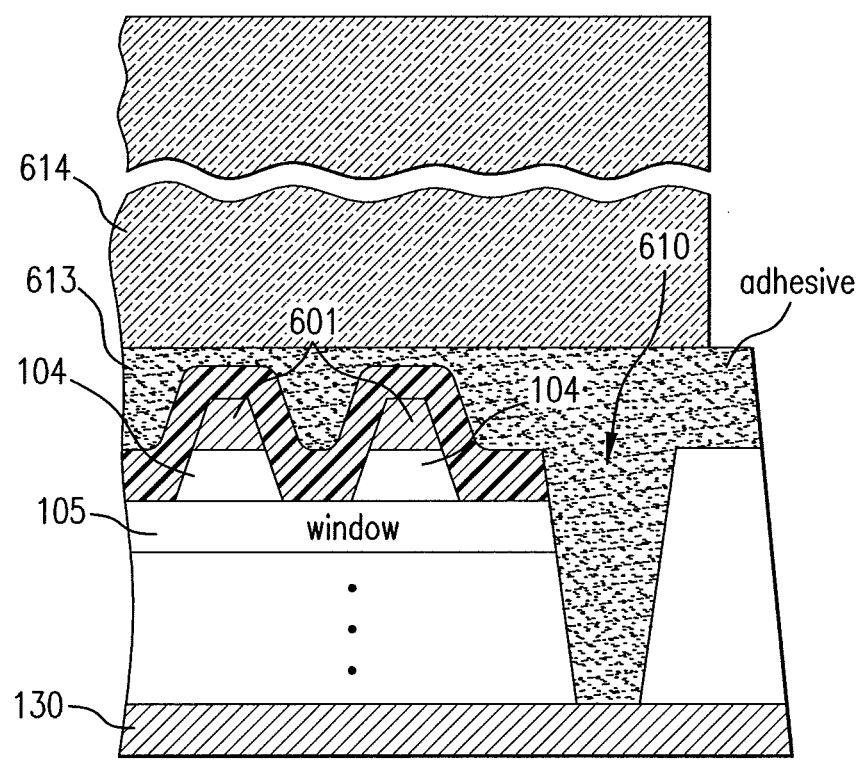
FIG. 19 is a cross-sectional view of the solar cell of FIG. 14A after the next process step in an embodiment of the present invention in which a cover glass in employed but the surrogate substrate is removed.

FIG. 19 is a cross-sectional view of the solar cell of FIG. 18 after the next process step in an embodiment of the present disclosure in which a cover glass in employed but the surrogate substrate is removed.

Figure 20:
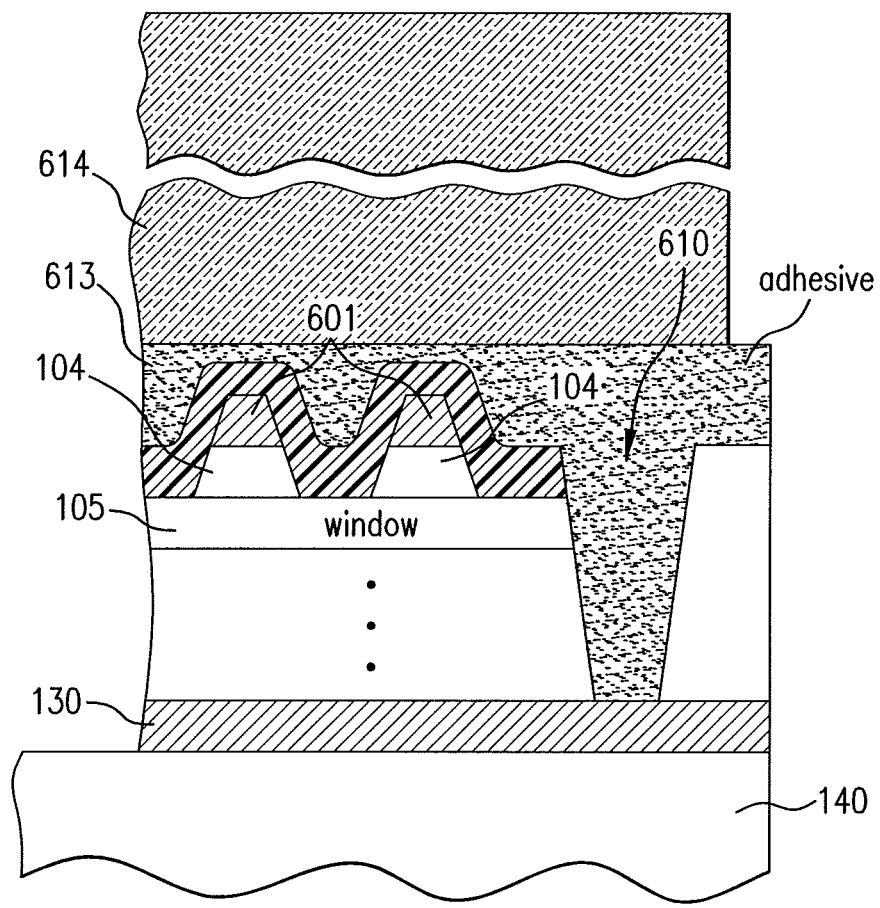
FIG. 20 is a cross-sectional view of the solar cell of FIG. 14A after the next process step in an embodiment of the present invention in which a cover glass in employed, the surrogate substrate is removed, and the solar cell is mounted on a new supporting member.

FIG. 20 is a cross-sectional view of the solar cell of FIG. 19 after the next process step in an embodiment of the present invention in which a cover glass in employed, the surrogate substrate is removed, and the solar cell is mounted on a new supporting member 140.

Figure 21:
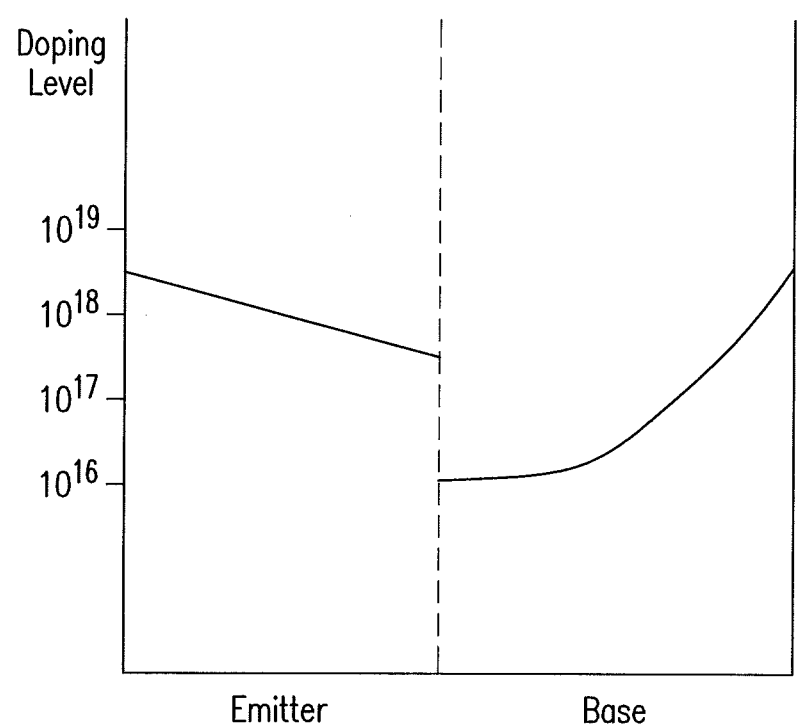
FIG. 21 is a graph of the doping profile in the base and emitter layers of a subcell in the metamorphic solar cell according to the present invention.

FIG. 21 is a graph of a doping profile in the emitter and base layers in one or more subcells of some embodiments of the inverted metamorphic multijunction solar cell of the present invention. The various doping profiles within the scope of the present invention, and the advantages of such doping profiles are more particularly described in copending U.S. patent application Ser. No. 11/956,069 filed Dec. 13, 2007, herein incorporated by reference. The doping profiles depicted herein are merely illustrative, and other more complex profiles may be utilized as would be apparent to those skilled in the art without departing from the scope of the present invention.

FIG. 22 is a graph representing the Al, Ga and In mole fractions versus the lattice constant in a AlGaInAs material system that is necessary to achieve a constant 1.5 eV band gap.

FIG. 23 is a diagram representing the relative concentration of Al, In, and Ga in an AlGaInAs material system needed to have a constant band gap with various designated values (ranging from 0.4 eV to 2.1 eV) as represented by curves on the diagram. The range of band gaps of various GaInAlAs materials are represented as a function of the relative concentration of Al, In, and Ga. This diagram illustrates how the selection of a constant band gap sequence of layers of GaInAlAs used in the metamorphic layer may be designed through the appropriate selection of the relative concentration of Al, In, and Ga to meet the different lattice constant requirements for each successive layer. Thus, whether 1.5 eV or 1.1 eV or other band gap value is the desired constant band gap, the diagram illustrates a continuous curve for each band gap, representing the incremental changes in constituent proportions as the lattice constant changes, in order for the layer to have the required band gap and lattice constant.

Figure 24:
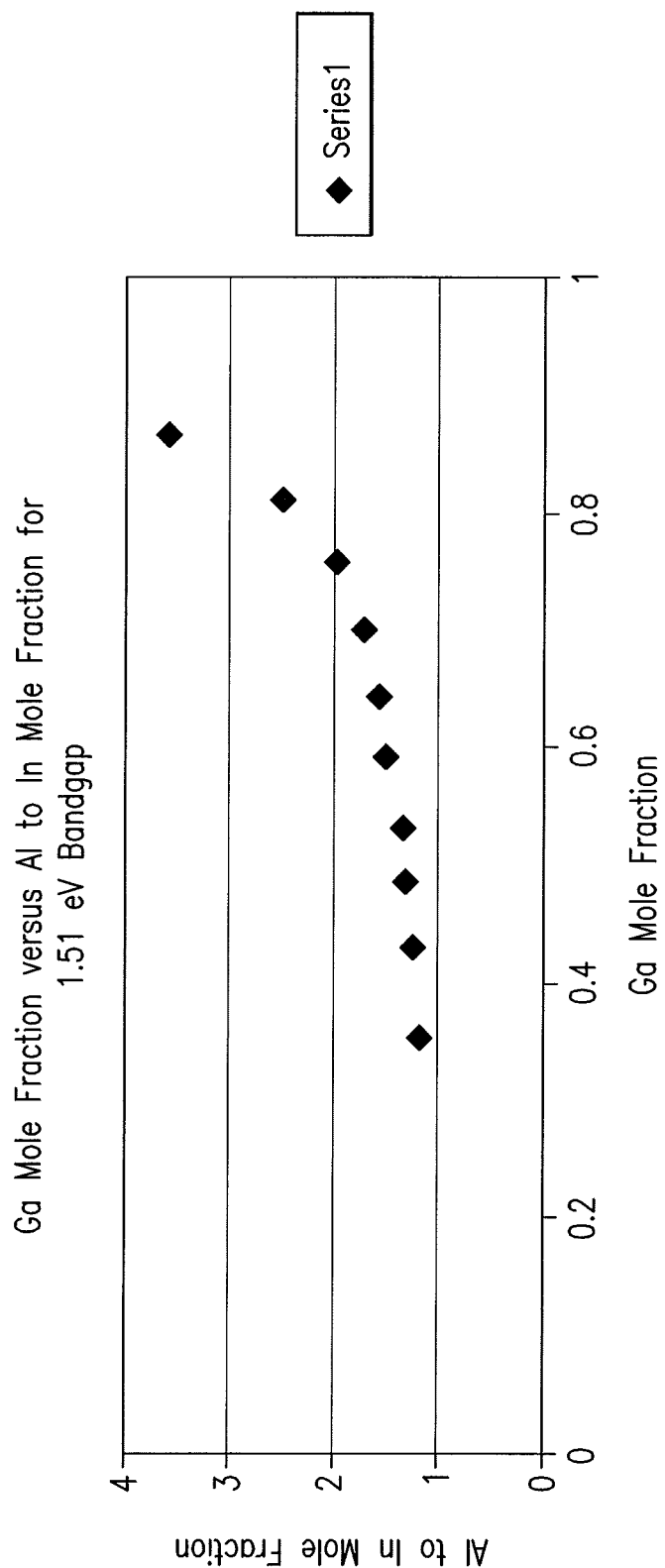
FIG. 24 is a graph representing the Ga mole fraction to the Al to In mole fraction in a AlGaInAs material system that is necessary to achieve a constant 1.51 eV band gap.

FIG. 24 is a graph that further illustrates the selection of a constant band gap sequence of layers of GaInAlAs used in the metamorphic layer by representing the Ga mole fraction versus the Al to In mole fraction in GaInAlAs materials that is necessary to achieve a constant 1.51 eV band gap.

Figure 25A:
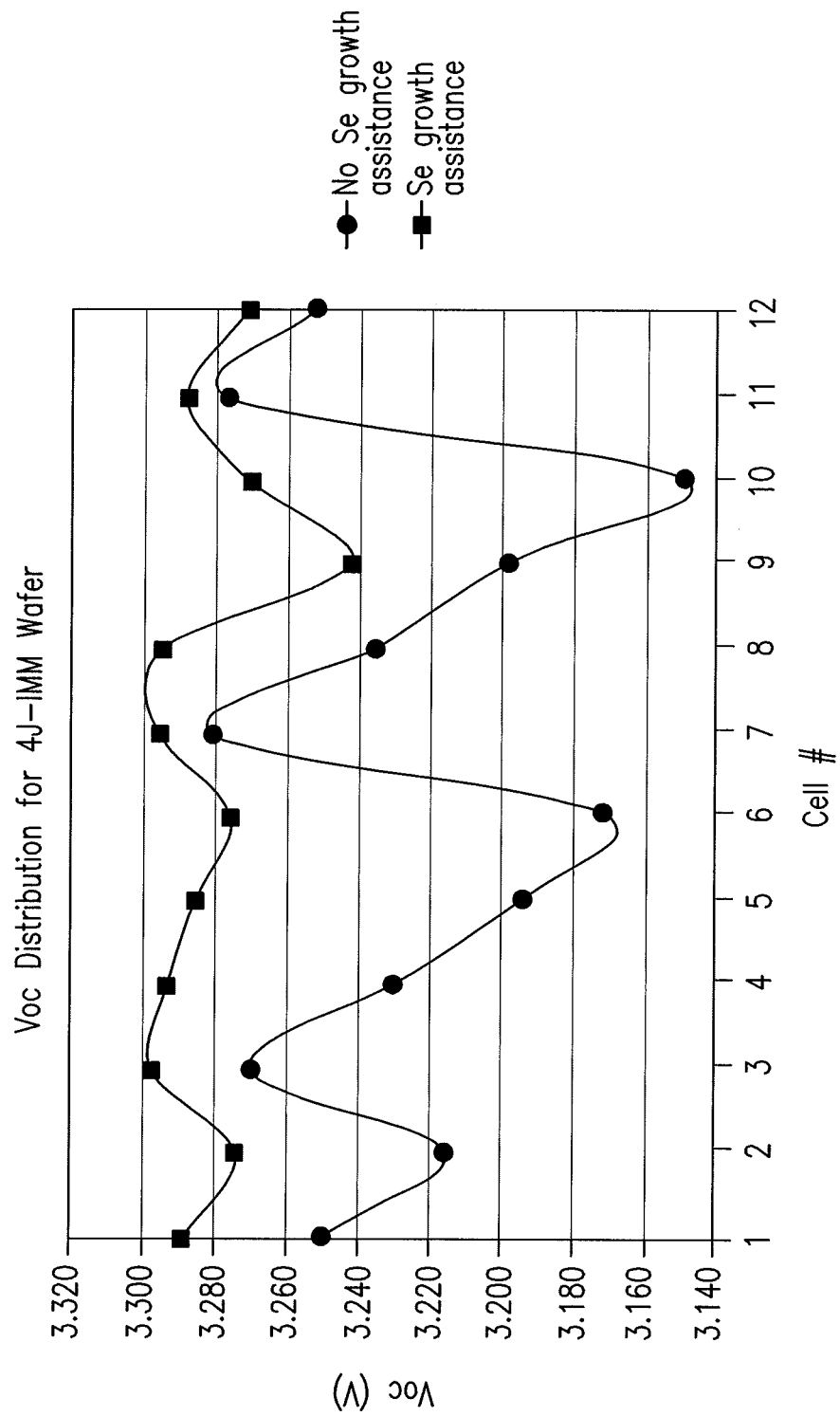
FIG. 25A is graph representing the measured open circuit voltage of each of the twelve solar cells in a test wafer as arranged in the layout depicted in FIG. 1 after implementing the selenium dopant/surfactant according to the present disclosure, compared with the results from test wafer of FIG. 2.

FIG. 25A is graph representing the measured open circuit voltage of each of the twelve solar cells in a test wafer as arranged in the layout depicted in FIG. 1 after implementing the selenium dopant/surfactant according to the present disclosure, compared with the results from test wafer with no doping represented in FIG. 2. A comparison of the two graphs depicted in FIG. 25A shows the beneficial effect of the use of a selenium surfactant compared to the use of no surfactant both in the increase in open circuit voltage, and the much smaller variation in open circuit voltage from cell to cell over the surface of the wafer.

Figure 25B:
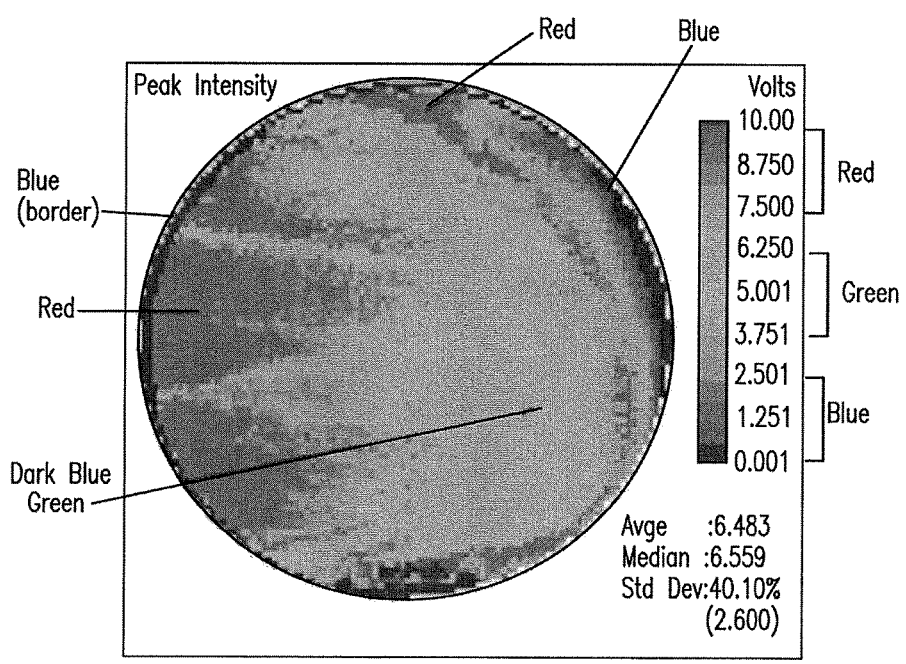
FIG. 25B is a top plan view of a photoluminescence measurement of a test solar cell wafer which shows the beneficial effect of the use of a selenium surfactant compared to the photoluminescence measurement of a test solar cell wafer with use of no surfactants shown in FIG. 1D.

FIG. 25B is a photoluminescence photograph of a test solar cell wafer which shows the beneficial effect of the use of a selenium surfactant in connection with the use of an alpha layer 115a according to the present disclosure, compared to the use of no surfactants in a similar test solar cell wafer (i.e. the solar cell structure being identical but having a barrier layer 115, instead of an alpha layer 115a) shown in FIG. 1D. It is noted that the standard deviation of the voltage measurements over the surface of the wafer is approximately 40%, considerably less than that of the similar test solar cell wafer shown in FIG. 1D, demonstrating the improvement achieved by the alpha layer 115a of the present disclosure.

Figure 26:
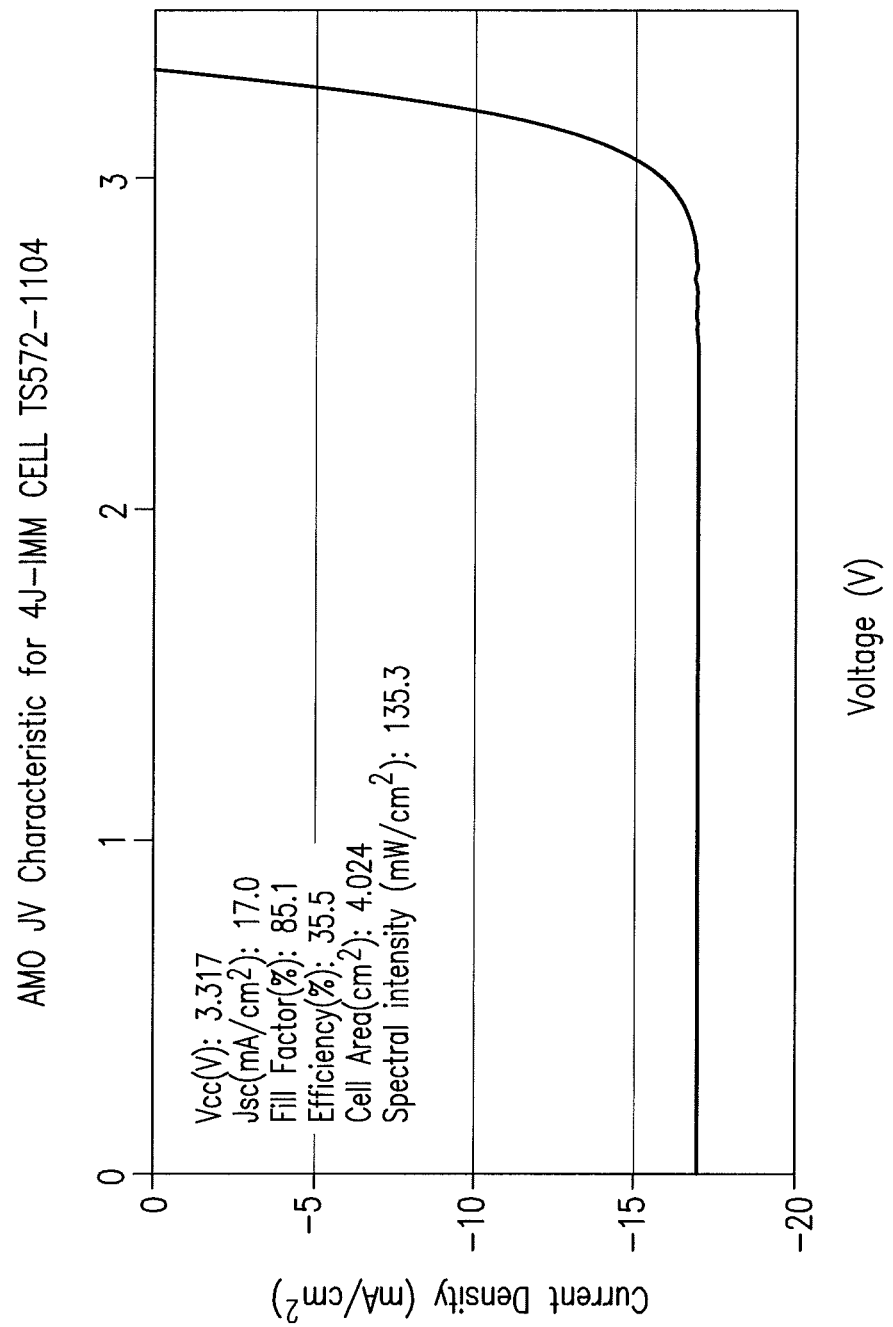
FIG. 26 is a graph that depicts the current and voltage characteristics of an inverted metamorphic multijunction solar cell according to the present disclosure.

FIG. 26 is a graph that depicts the current and voltage characteristics of the solar cell that is representative of inverted metamorphic multijunction solar cells disclosed in the related applications noted above and according to the present disclosure under simulated AM0 illumination. The solar cell has an open circuit voltage ($V_{oc}$) of approximately 3.317 volts, a short circuit current of approximately 17.0 mA/cm$^2$, a fill factor of approximately 85.1%, and an efficiency of 35.5%.

It will be understood that each of the elements described above, or two or more together, also may find a useful application in other types of constructions differing from the types of constructions described above.

Although some of the embodiments of the present disclosure utilizes a vertical stack of three or four subcells, the present invention can apply to stacks with fewer or greater number of subcells, i.e. two junction cells, five junction cells, etc. as more particularly described in U.S. patent application Ser. No. 12/267,812 filed Nov. 10, 2008. In the case of four or more junction cells, the use of more than one metamorphic grading interlayer may also be utilized, as more particularly described in U.S. patent application Ser. No. 12/271,192, filed Nov. 14, 2008.

In addition, although in some embodiments the solar cell is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, embodiments of the present invention may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, as more particularly described in U.S. patent application Ser. No. 12/023,772 filed Jan. 31, 2008, the present invention may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

In some embodiments, a thin so-called "intrinsic layer" may be placed between the emitter layer and base layer of some subcells, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness. Some such configurations are more particularly described in copending U.S. patent application Ser. No. 12/253,051 filed Oct. 16, 2008.

The composition of the window or BSF layers may utilize other semiconductor compounds, subject to lattice constant and band gap requirements, and in some embodiments may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the invention has been illustrated and described as embodied in an inverted metamorphic multijunction solar cell, it is not intended to be limited to the details shown, since various modifications and structural changes may be made without departing in any way from the spirit of the present invention.

Thus, while the description of this invention has focused primarily on solar cells or photovoltaic devices, persons skilled in the art know that other optoelectronic devices, such as, thermophotovoltaic (TPV) cells, photodetectors and light-emitting diodes (LEDs) are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

The invention claimed is:

1. A method of forming a multijunction solar cell comprising at least an upper subcell, a middle subcell, and a lower subcell, the method comprising:
   providing a first substrate for an epitaxial growth of semiconductor material;
   forming a first solar subcell on said substrate having a first band gap;
   forming a second solar subcell over said first solar subcell having a second band gap smaller than said first band gap;
   forming a first alpha layer composed of GaInP over said second solar subcell using a surfactant including selenium, wherein the selenium is introduced as a precursor gas of di-isopropyl selenide, and the first alpha layer is configured to prevent threading dislocations from propagating;
   forming a metamorphic grading interlayer over and directly adjacent to said first alpha layer, said grading interlayer having a third band gap greater than said second band gap, and the grading interlayer having a different composition than the first alpha layer;
   forming a second alpha layer composed of GaInP using a surfactant including selenium over and directly adjacent to said grading interlayer to prevent threading dislocations from propagating, wherein the selenium is introduced as a precursor gas of di-isopropyl selenide, and the second alpha layer has a different composition than the grading interlayer; and forming a third solar subcell over said grading interlayer having a fourth band gap smaller than said second band gap such that said third solar subcell is lattice mismatched with respect to said second solar subcell;

the grading interlayer being compositionally graded with a lattice constant that matches the lattice constant of the second solar subcell on a first side and matches the lattice constant of the third solar subcell on a second side; and the grading interlayer having a different composition than each of the first and second alpha layers;

wherein each alpha layer is between 0.2 and 0.5 microns in thickness and doped with the selenium from $1.0 \times 10^{16}$ free carriers per cubic centimeter to $4.0 \times 10^{17}$ free carriers per cubic centimeter.

2. A method as defined in claim 1, wherein said first alpha layer has a band gap energy greater than or equal to that of the grading interlayer.

3. A method as defined in claim 1 wherein said second alpha layer has a bandgap energy greater than or equal to that of the grading interlayer.

4. A method as defined in claim 1, wherein said first subcell in composed of an GaInP, GaAs, GaInAs, GaAsSb, or GaInAsN emitter region and an GaAs, GaInAs, GaAsSb, or GaInAsN base region; the second subcell is composed of an InGaAs base and emitter regions, or an InGaP emitter region and a GaAs base region; and the third subcell is composed of an InGaP emitter region and an InGaAs base region.

5. A method as defined in claim 1, wherein said grading interlayer is composed of any of the As, N, Sb based III-V compound semiconductors subject to the constraints of having the in-plane lattice parameter greater or equal to that of the second solar subcell and less than or equal to that of the third solar subcell, and having a band gap energy greater than that of the second solar subcell.

6. A method as defined in claim 1, wherein the grading interlayer material is composed of $(In_xGa_{1-x})_yAl_{1-y}As$ with $0<x<1$ and $0<y<1$, and x and y selected such that the band gap of the transition material remains constant throughout its thickness.

7. A method as defined in claim 1, further comprising attaching a surrogate second substrate over said third solar subcell and removing the first substrate.

8. A method as defined in claim 1, wherein the selenium is doped into each alpha layer directly on each side of the grading interlayer to minimize threading dislocations from advancing from the grading interlayer into the adjacent second and third solar subcells.

9. A method of forming a multijunction solar cell comprising at least an upper subcell, a middle subcell, and a lower subcell, the method comprising:

providing a first substrate for an epitaxial growth of semiconductor material;

forming a first solar subcell on said substrate having a first band gap;

forming a second solar subcell over said first solar subcell having a second band gap smaller than said first band gap;

forming a first alpha layer composed of GaInP over said second solar subcell using a surfactant including selenium, wherein the selenium is introduced as a precursor gas of di-isopropyl selenide, and the first alpha layer is configured to prevent threading dislocations from propagating;

forming a metamorphic grading interlayer over and directly adjacent to said first alpha layer, said grading interlayer having a third band gap greater than said second band gap, and the grading interlayer having a different composition than the first alpha layer;

forming a second alpha layer composed of GaInP using a surfactant including selenium over and directly adjacent to said grading interlayer to prevent threading dislocations from propagating, wherein the selenium is introduced as a precursor gas of di-isopropyl selenide, and the second alpha layer has a different composition than the grading interlayer; and forming a third solar subcell over said grading interlayer having a fourth band gap smaller than said second band gap such that said third solar subcell is lattice mismatched with respect to said second solar subcell;

the grading interlayer being compositionally graded with a lattice constant that matches the lattice constant of the second solar subcell on a first side and matches the lattice constant of the third solar subcell on a second side; and the grading interlayer having a different composition than each of the first and second alpha layers;

wherein the solar cell has an open circuit voltage ($V_{oc}$) of approximately 3.317 volts, a short circuit current of approximately 17.0 mA/cm$^2$, a fill factor of approximately 85.1%, and an efficiency of 35.5%.

10. A method of forming a multijunction solar cell comprising at least an upper subcell, a middle subcell, and a lower subcell, the method comprising:

providing a first substrate for an epitaxial growth of semiconductor material;

forming a first solar subcell having a first band gap and composed of an GaInP, GaAs, GaInAs, GaAsSb, or GaInAsN emitter region and an GaAs, GaInAs, GaAsSb, or GaInAsN base region on said substrate;

forming a second solar subcell having a second band gap smaller than said first band gap and composed of an InGaAs base and emitter regions, or an InGaP emitter region and a GaAs base region over said first solar subcell;

forming a first alpha layer composed of GaInP and having a band gap energy greater than or equal to that of the grading interlayer over said second solar subcell using a surfactant including selenium, wherein the selenium is introduced as a precursor gas of di-isopropyl selenide, and the first alpha layer is configured to prevent threading dislocations from propagating;

forming a metamorphic grading interlayer composed of $(In_xGa_{1-x})_yAl_{1-y}As$ with $0<x<1$ and $0<y<1$, and x and y selected such that the band gap of the transition material remains constant throughout its thickness over and directly adjacent to said first alpha layer, said grading interlayer having a third band gap greater than said second band gap and subject to the constraints of having the in-plane lattice parameter greater or equal to that of the second solar subcell and less than or equal to that of the third solar subcell, and the grading interlayer having a different composition than the first alpha layer;

forming a second alpha layer composed of GaInP and having a band gap energy greater than or equal to that of the grading interlayer using a surfactant including selenium over and directly adjacent to said grading interlayer to prevent threading dislocations from propagating, wherein the selenium is introduced as a precursor gas of di-isopropyl selenide, and the second alpha layer has a different composition than the grading interlayer;

forming a third solar subcell composed of an InGaP emitter region and an InGaAs base region over said grading interlayer and having a fourth band gap smaller than said second band gap such that said third solar subcell is lattice mismatched with respect to said second solar subcell; and attaching a surrogate second substrate over said third solar subcell and removing the first substrate;

wherein the grading interlayer is compositionally graded with a lattice constant that matches the lattice constant of the second solar subcell on a first side and matches the lattice constant of the third solar subcell on a second side; and the grading interlayer having a different composition than each of the first and second alpha layers;

wherein each alpha layer is between 0.2 and 0.5 microns in thickness and doped with the selenium from $1.0 \times 10^{16}$ free carriers per cubic centimeter to $4.0 \times 10^{17}$ free carriers per cubic centimeter; and wherein the solar cell has an open circuit voltage ($V_{oc}$) of approximately 3.317 volts, a short circuit current of approximately 17.0 mA/cm$^2$, a fill factor of approximately 85.1%, and an efficiency of 35.5%.

* * * * *